United States Patent
Basu et al.

(10) Patent No.: US 10,219,409 B2
(45) Date of Patent: Feb. 26, 2019

(54) WICKLESS CAPILLARY DRIVEN CONSTRAINED VAPOR BUBBLE HEAT PIPES FOR APPLICATION IN DISPLAY DEVICES

(71) Applicant: Intel Corporation, Santa Clara, CA (US)

(72) Inventors: Sumita Basu, Portland, OR (US); Shantanu D. Kulkarni, Hillsboro, OR (US); Prosenjit Ghosh, Portland, OR (US); Konstantin I. Kouliachev, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/393,263

(22) Filed: Dec. 29, 2016

(65) Prior Publication Data
US 2017/0318687 A1 Nov. 2, 2017

Related U.S. Application Data

(60) Provisional application No. 62/329,359, filed on Apr. 29, 2016.

(51) Int. Cl.
*G06F 1/16* (2006.01)
*H05K 7/20* (2006.01)
(Continued)

(52) U.S. Cl.
CPC ........... *H05K 7/20336* (2013.01); *F28C 3/08* (2013.01); *F28D 15/025* (2013.01);
(Continued)

(58) Field of Classification Search
CPC .... G06F 1/20; H05K 5/0017; H05K 7/20336; G02F 2001/133628; F21V 29/006
See application file for complete search history.

(56) References Cited

U.S. PATENT DOCUMENTS 4,763,727 A    8/1988    Kreuzer et al.
4,995,451 A    2/1991    Hamburgen
(Continued)

FOREIGN PATENT DOCUMENTS

JP    9191440    7/1997
JP    2003110273    4/2003
(Continued)

OTHER PUBLICATIONS

International Searching Authority, "Written Opinion", issued in connection with PCT patent application No. PCT/US2017/025120, dated Jun. 20, 2017, 8 pages.
(Continued)

*Primary Examiner* — Adrian S Wilson
(74) *Attorney, Agent, or Firm* — Hanley, Flight and Zimmerman, LLC

(57) ABSTRACT

A system and method for providing and using wickless capillary driven constrained vapor bubble heat pipes for application in display devices are disclosed. An example embodiment includes: a display device layer fabricated from a substrate, the display device layer including a plurality of in-built channels integrated therein; and a plurality of wickless capillary driven constrained vapor bubble heat pipes being embedded into the plurality of in-built channels, each wickless capillary driven constrained vapor bubble heat pipe including a body having a capillary therein with generally square corners and a high energy interior surface, and a highly wettable liquid partially filling the capillary to dissipate heat between an evaporator region and a condenser region.

24 Claims, 26 Drawing Sheets

(51) Int. Cl.

| | |
|---|---|
| *G06F 1/20* | (2006.01) |
| *H01L 21/48* | (2006.01) |
| *H01L 23/427* | (2006.01) |
| *H01L 23/538* | (2006.01) |
| *H05K 1/02* | (2006.01) |
| *H05K 1/18* | (2006.01) |
| *H05K 3/00* | (2006.01) |
| *F28D 15/02* | (2006.01) |
| *F28D 15/04* | (2006.01) |
| *F28F 13/16* | (2006.01) |
| *F28C 3/08* | (2006.01) |
| *H05K 5/00* | (2006.01) |
| *F28D 21/00* | (2006.01) |
| *F21V 8/00* | (2006.01) |
| *G02F 1/1333* | (2006.01) |

(52) U.S. Cl.
CPC ..... *F28D 15/0233* (2013.01); *F28D 15/0275* (2013.01); *F28D 15/0283* (2013.01); *F28D 15/046* (2013.01); *F28F 13/16* (2013.01); *G06F 1/1601* (2013.01); *G06F 1/20* (2013.01); *H01L 21/4846* (2013.01); *H01L 21/4871* (2013.01); *H01L 23/427* (2013.01); *H01L 23/5389* (2013.01); *H05K 1/0203* (2013.01); *H05K 1/185* (2013.01); *H05K 3/0017* (2013.01); *H05K 3/0044* (2013.01); *H05K 5/0017* (2013.01); *H05K 7/20318* (2013.01); *H05K 7/20809* (2013.01); *F28D 2021/0029* (2013.01); *F28F 2215/06* (2013.01); *G02B 6/0085* (2013.01); *G02F 1/133385* (2013.01); *H05K 2201/064* (2013.01)

(56) References Cited

U.S. PATENT DOCUMENTS

| | | | |
|---|---|---|---|
| 5,309,986 | A | 5/1994 | Itoh |
| 5,379,830 | A | 1/1995 | Itoh |
| 5,660,229 | A | 8/1997 | Lee et al. |
| 6,005,649 | A | 12/1999 | Krusius et al. |
| 6,062,302 | A | 5/2000 | Davis et al. |
| 6,374,905 | B1 | 4/2002 | Tantoush |
| 6,758,263 | B2 | 7/2004 | Krassowski et al. |
| 6,917,522 | B1 | 7/2005 | Erturk et al. |
| 7,727,847 | B2* | 6/2010 | Tanaka .............. H01L 21/76802 438/314 |
| 7,978,472 | B2 | 7/2011 | Campbell et al. |
| 8,351,207 | B2 | 1/2013 | Jang et al. |
| 8,737,071 | B2 | 5/2014 | Hao et al. |
| 2004/0257768 | A1* | 12/2004 | Ohmi .................. H05K 7/20336 361/700 |
| 2005/0141197 | A1 | 6/2005 | Erturk et al. |
| 2006/0245214 | A1* | 11/2006 | Kim ...................... G02B 6/0068 362/632 |
| 2007/0019419 | A1* | 1/2007 | Hafuka .............. G02F 1/133603 362/373 |
| 2007/0107875 | A1 | 5/2007 | Lee et al. |
| 2007/0240855 | A1 | 10/2007 | Hou et al. |
| 2007/0240858 | A1 | 10/2007 | Hou et al. |
| 2008/0062649 | A1* | 3/2008 | Leng ...................... H01L 23/427 361/700 |
| 2009/0009974 | A1 | 1/2009 | Tseng et al. |
| 2009/0011547 | A1 | 1/2009 | Lu et al. |
| 2009/0016023 | A1 | 1/2009 | Cao et al. |
| 2010/0006846 | A1* | 1/2010 | Nakamura .............. H01L 27/12 257/59 |
| 2012/0120604 | A1 | 5/2012 | Hao et al. |
| 2013/0092354 | A1 | 4/2013 | Semenov et al. |
| 2013/0343002 | A1 | 12/2013 | Kim et al. |
| 2014/0376189 | A1 | 12/2014 | Sakaguchi |
| 2015/0253823 | A1* | 9/2015 | Han ....................... G06F 1/203 361/679.52 |
| 2016/0088769 | A1 | 3/2016 | Hsiao |
| 2017/0314871 | A1 | 11/2017 | Basu et al. |
| 2017/0314874 | A1 | 11/2017 | Basu et al. |
| 2017/0318702 | A1 | 11/2017 | Basu et al. |

FOREIGN PATENT DOCUMENTS

| | | |
|---|---|---|
| JP | 2010079403 | 4/2010 |
| JP | 2011155055 | 8/2011 |
| JP | 2012529759 | 11/2012 |
| KR | 20050117482 | 12/2005 |
| WO | 2016004531 | 1/2016 |

OTHER PUBLICATIONS

International Searching Authority, "Search Report", issued in connection with PCT patent application No. PCT/US2017/025120, dated Jun. 20, 2017, 3 pages.

International Searching Authority, "International Search Report", issued in connection with PCT patent application No. PCT/US2017/025109, dated May 31, 2017, 5 pages.

International Searching Authority, "Written Opinion", issued in connection with PCT patent application No. PCT/US2017/025109, dated May 31, 2017, 6 pages.

International Searching Authority, "International Search Report", issued in connection with PCT patent application No. PCT/US2017/025100, dated Jun. 16, 2017, 5 pages.

International Searching Authority, "Written Opinion", issued in connection with PCT patent application No. PCT/US2017/025100, dated Jun. 16, 2017, 6 pages.

International Searching Authority, "Written Opinion", issued in connection with PCT patent application No. PCT/US2017/025096, dated May 31, 2017, 5 pages.

International Searching Authority, "International Search Report", issued in connection with PCT patent application No. PCT/US2017/025096, dated May 31, 2017, 3 pages.

International Searching Authority, "International Search Report", issued in connection with PCT patent application No. PCT/US2017/025088, dated May 31, 2017, 3 pages.

International Searching Authority, "Written Opinion", issued in connection with PCT patent application No. PCT/US2017/025088, dated May 31, 2017, 6 pages.

United States Patent and Trademark Office, "Non-Final Office action," issued in connection with U.S. Appl. No. 15/393,251, dated Sep. 26, 2018, 14 pages.

United States Patent and Trademark Office, "Requirement for Restriction," mailed in connection with U.S. Appl. No. 15/393,258, dated Sep. 26, 2018, 5 pages.

International Searching Authority, "International Preliminary Report on Patentability," issued in connection with PCT Patent Application No. PCT/US2017/025100, dated Oct. 30, 2018, 7 pages.

International Searching Authority, "International Preliminary Report on Patentability," issued in connection with PCT Patent Application No. PCT/US2017/025120, dated Oct. 30, 2018, 9 pages.

International Searching Authority, "International Preliminary Report on Patentability," issued in connection with PCT Patent Application No. PCT/US2017/025088, dated Oct. 30, 2018, 7 pages.

International Searching Authority, "International Preliminary Report on Patentability," issued in connection with PCT Patent Application No. PCT/US2017/025096, dated Oct. 30, 2018, 6 pages.

International Searching Authority, "International Preliminary Report on Patentability," issued in connection with PCT Patent Application No. PCT/US2017/025109, dated Oct. 30, 2018, 7 pages.

United States Patent and Trademark Office, "Restriction Requirement," issued in connection with U.S. Appl. No. 15/393,258, dated Dec. 26, 2018, 6 pages.

United States Patent and Trademark Office, "Final Office action," issued in connection with U.S. Appl. No. 15/393,251, dated Jan. 15, 2019, 17 pages.

* cited by examiner

Operating temperature ranges of various working fluids
(Logarithmic temperature scale)

```
          ┌─────────────────────────────────────────────┐
          │ Process Logic For Providing and Using a Wickless Capillary │
          │   Driven Constrained Vapor Bubble Heat Pipe   │
          │        for Application in Display Devices     │
          │                   -1100-                      │
          └─────────────────────────────────────────────┘
                                │
                                ▼
          ┌─────────────────────────────────────────────┐
          │     Fabricate a display device layer from a substrate. │
          │                   -1110-                      │
          └─────────────────────────────────────────────┘
                                │
                                ▼
          ┌─────────────────────────────────────────────┐
          │ Integrate a plurality of in-built channels into the display device layer. │
          │                   -1120-                      │
          └─────────────────────────────────────────────┘
                                │
                                ▼
          ┌─────────────────────────────────────────────┐
          │ Embed a plurality of wickless capillary driven constrained vapor bubble heat │
          │  pipes into the plurality of in-built channels, each wickless capillary driven │
          │ constrained vapor bubble heat pipe including a body having a capillary therein │
          │ with generally square corners and a high energy interior surface, and a highly │
          │    wettable liquid partially filling the capillary to dissipate heat between an │
          │              evaporator region and a condenser region. │
          │                   -1130-                      │
          └─────────────────────────────────────────────┘
                                │
                                ▼
                             ( End )
```

FIG. 26

WICKLESS CAPILLARY DRIVEN CONSTRAINED VAPOR BUBBLE HEAT PIPES FOR APPLICATION IN DISPLAY DEVICES

PRIORITY PATENT APPLICATION

This is a non-provisional patent application claiming priority to U.S. provisional patent application, Ser. No. 62/329,359; filed Apr. 29, 2016. This non-provisional patent application draws priority from the referenced provisional patent application. The entire disclosure of the referenced patent application is considered part of the disclosure of the present application and is hereby incorporated by reference herein in its entirety.

TECHNICAL FIELD

This patent application relates to electronic systems and devices, mobile devices, and the fabrication and thermal dissipation of such devices and systems, according to various example embodiments, and more specifically to a system and method for providing and using wickless capillary driven constrained vapor bubble heat pipes for application in display devices.

BACKGROUND

Modern electric or electronic devices include many components that generate heat, including, but not limited to processors/controllers, signal processing devices, memory devices, communication/transceiver devices, power generation devices, and the like. Adequate thermal management of these components is critical to the successful operation of these systems and devices. When components generate a large amount of heat, the heat must be dissipated or transported quickly away from the heat source in order to prevent failure of the heat producing components.

In the past, thermal management of electronic components has included air-cooling systems and liquid-cooling systems. Regardless of the type of fluid used (e.g., air or liquid), it may be challenging to deliver the fluid to the heat source, e.g., the component generating large amounts of heat. For example, electronic devices, such as mobile devices or wearables, may include processors and/or integrated circuits within enclosures that make it difficult for a cooling fluid to reach the heat generating components.

To transfer the heat away from these difficult to access components, conventional solutions use plates made from highly thermally-conductive material, such as graphite or metal, that have been placed in thermal contact with the heat generating components such that the heat is carried away via conduction through the plate. However, the speed and efficiency of the heat transport in a solid plate is limited by the thermal resistance of the material.

Conventional solutions also use wicked heat pipes to transfer heat from a heated region (also referred to as an evaporator region) to a cooled region (also referred to as a condenser region). A traditional wicked heat pipe consists of a tube with a wick running along the interior surface of the tube. The tube is filled with a liquid that evaporates into a vapor at the evaporator region, which then flows toward the condenser region. The vapor condenses back into a liquid at the condenser region. The wick enables the condensed liquid to flow back to the evaporator region for the cycle to repeat.

However, there are many challenges with wicked or grooved structures in integrated vapor chambers or liquid cooled heat pipes on standard Printed Circuit Boards (PCBs), for example. A few of these disadvantages with conventional wicked or grooved structures are summarized below:

- Micro-grooved structures showed poor performance in gravity operations;
- Lack of fluid crossover ability causes circulation challenges;
- The wicks cause a thermal resistance inside the pipe itself;
- Insertion of a wick structure (regardless of porosity and design) is a challenge and not a common practice for PCB manufacturers;
- Insertable wick requires an additional copper restraint to hold it in place to allow for a cavity for vapor;
- The inside of vapor chambers and heat pipes is usually coated in sintered metal, which creates problems. The basic problem is that the inside of both the vapor chamber and the heat pipe have very little surface area.

Thermal dissipation is a key factor that limits the lumen output of traditional display devices. These display device technologies can be of a variety of types including: cathode ray tube displays (CRT), light-emitting diode displays (LED), electroluminescent displays (ELD), plasma display panels (PDP), liquid crystal displays (LCD), organic light-emitting diode displays (OLED), and other types of display technologies. LED bulbs, for example, are available that are as much as 80 percent more energy efficient than traditional incandescent lighting; but, the LED components and the driver electronics still create a considerable amount of excess heat. If this excess heat is not dissipated properly, the LED light quality and life expectancy decrease dramatically.

Heat sinks can solve thermal management problems for some low-lumen LED lamps. Lighting manufacturers have developed viable 40 W-equivalent and 60 W-equivalent LED retrofits for some lamps. However, thermal management becomes a challenge for high lumen lamps. For example, a heat sink alone will not cool a 75 W- or 100 W-equivalent lamp.

Display device consumers and their manufacturers demand these high brightness, high lumen light sources for state-of-the-art display devices. These on-going requirements for high lumen light elements have consumers and manufacturers looking for light source technologies that have good light quality, a long useful life, and a high lumen output. However, these requirements are challenging given the need to dissipate the excess heat generated by densely packed arrays of high lumen light elements in the constrained form factor of a display device. In order to reach the desired lumen values in a fixed form factor, active cooling may be required to dissipate the heat produced by the lighting components. Some conventional active cooling solutions, such as fans, don't have the same life expectancy as the lighting elements themselves. Other conventional active cooling systems fail to provide a viable active cooling solution for high-brightness lighting elements, while being inherently low in energy consumption, flexible enough to fit into a small form factor, and having an expected useful life equal to or greater than that of the lighting elements.

BRIEF DESCRIPTION OF THE DRAWINGS

The various embodiments are illustrated by way of example, and not by way of limitation, in the figures of the accompanying drawings in which:

FIG. 26 is a process flow chart illustrating an example embodiment of a method as described herein.

DETAILED DESCRIPTION

In the following description, for purposes of explanation, numerous specific details are set forth in order to provide a thorough understanding of the various embodiments. It will be evident, however, to one of ordinary skill in the art that the various embodiments may be practiced without these specific details.

Figure 1:
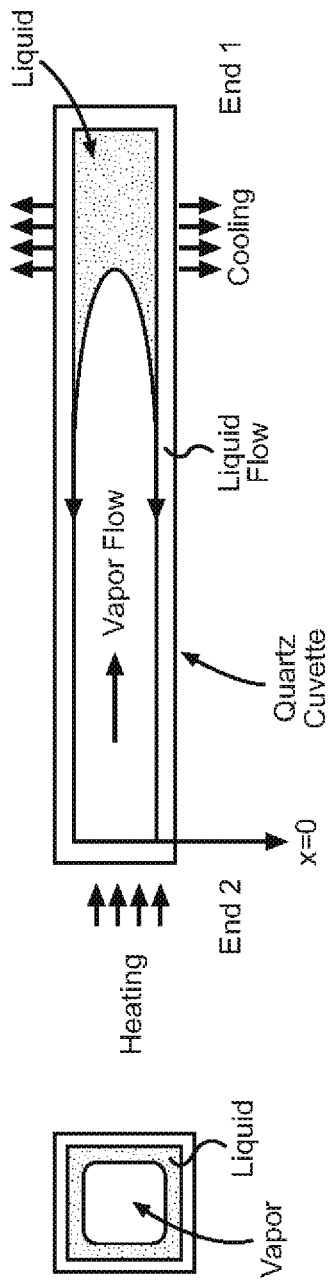
FIG. 1 illustrates an example embodiment of the wickless capillary driven constrained vapor bubble (CVB) heat pipe as disclosed herein.

In the various embodiments described herein, a system and method for providing and using a wickless capillary driven constrained vapor bubble (CVB) heat pipe are disclosed. FIG. 1 illustrates an example embodiment of the wickless capillary driven CVB heat pipe as disclosed herein. The various example embodiments disclosed herein provide a variety of advantages over conventional solutions. For example, the wickless CVB heat pipe of the various example embodiments disclosed herein:

Leads to simpler and lighter systems;
Can be used for space and electronic cooling applications;
Is effective as the dimension of the cavity can be reduced and the heat pipe can become a micro heat pipe;
Is easier to manufacture by PCB manufacturers or other device fabricators, as there are no wick structures to insert or adhere to the walls of the heat pipe;
Does not require moving parts; and
Capillary forces in the corners of the channels drive the liquid to the evaporator. As a result, there are no challenges because of wicks or grooved structures as described above. Circular or rounded corner channels do not provide this advantage.

Figure 2:
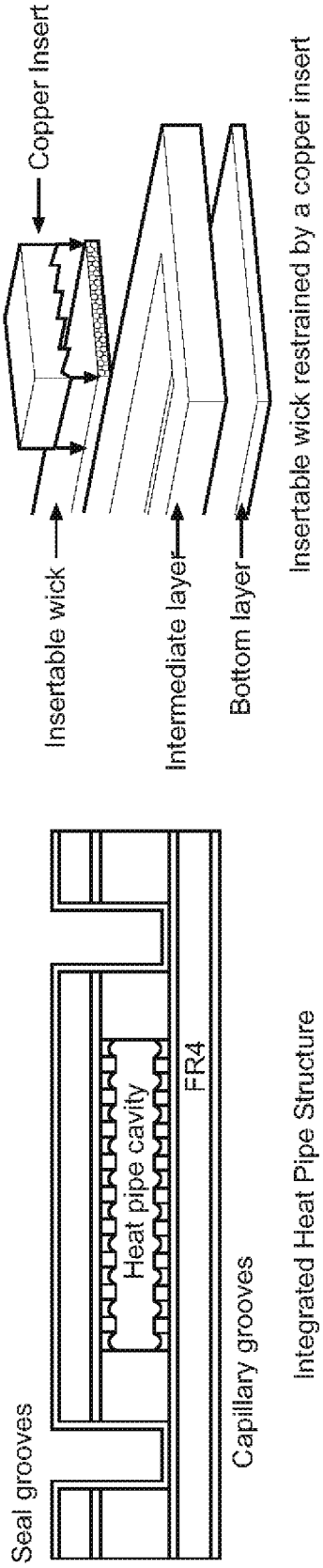
FIGS. 2 and 3 illustrate some of the disadvantages of the conventional wicked or grooved heat pipe structures.
Figure 3:
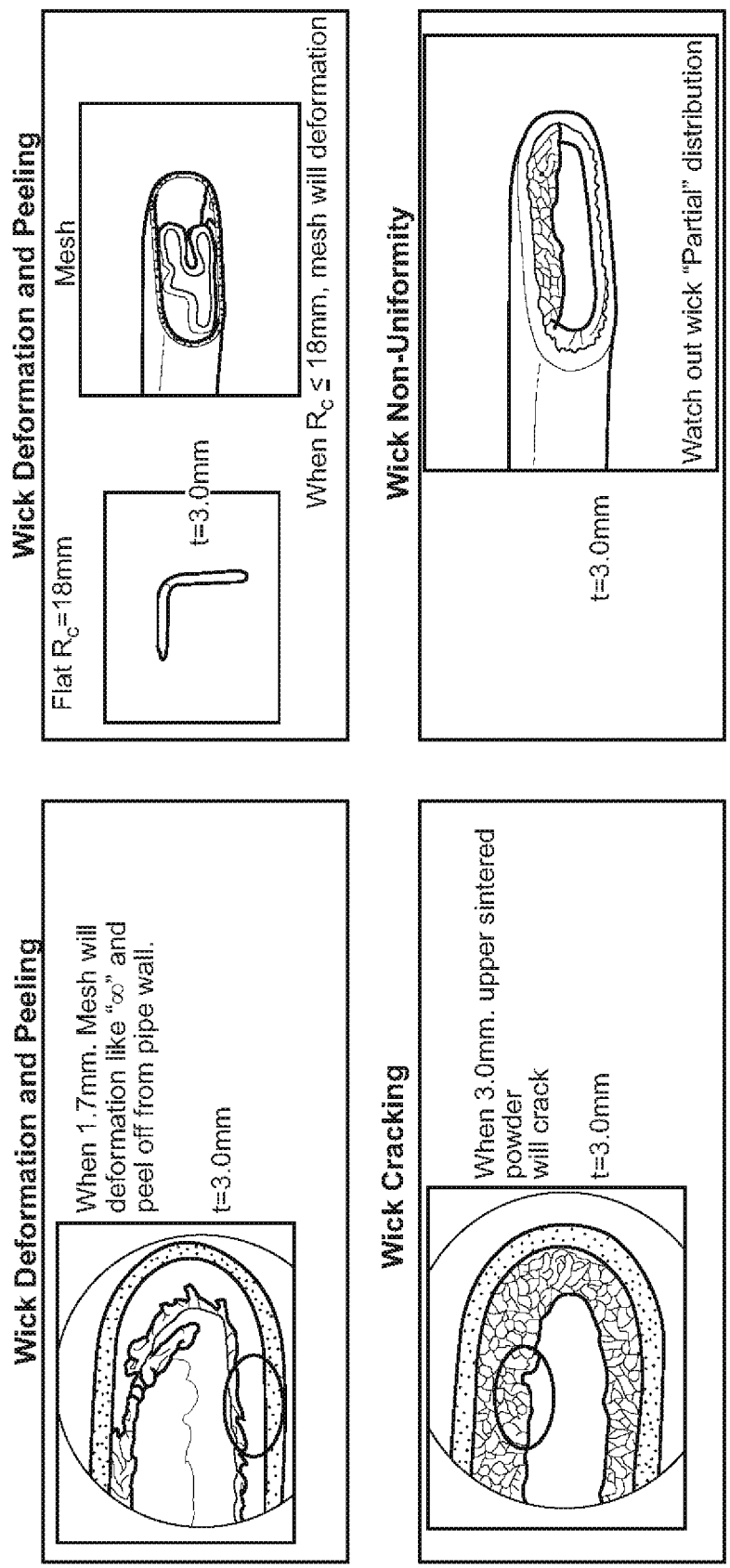

FIGS. 2 and 3 illustrate some of the disadvantages of the conventional wicked or grooved heat pipe structures. A few of these disadvantages with conventional wicked or grooved structures are summarized below:

Micro-grooved structures showed poor performance in gravity operations;
Lack of fluid crossover ability causes circulation challenges;
The wicks cause a thermal resistance inside the pipe itself;
Insertion of a wick structure (regardless of porosity and design) is a challenge and not a common practice for PCB manufacturers;
Insertable wicks require an additional copper restraint to hold it in place to allow a cavity for vapor;
The insides of the vapor chambers and the heat pipes are usually coated in sintered metal, which creates problems. The basic problem is that the inside of both the vapor chamber and the heat pipe have very little surface area; and
Wicked heat pipes have a tendency to experience "dryout," whereby the liquid in the evaporator region is fully vaporized and the wick becomes void of liquid.

Figure 4A:
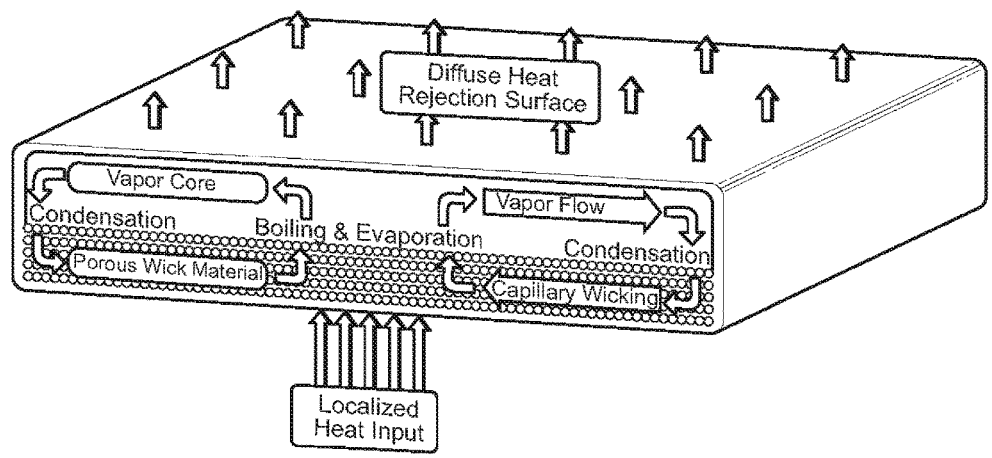
FIG. 4A illustrates an example of nucleate boiling in porous wick structures.

FIG. 4A illustrates an example of nucleate boiling in porous wick structures. Conventional wisdom calls for nucleate boiling to be avoided in wicked heat pipes having longitudinal groove wick structures. In these wicks, nucleation of vapor bubbles completely obstructs the non-communicating individual paths of capillary liquid return to the evaporator section; a boiling limit is imposed in this case based on the conventional nucleation incipience superheat criterion. Alternatively, sintered screen mesh, sintered powder, and fibrous wick structures affixed to the wall of a heat pipe can continue to feed liquid to the heat source during boiling via the inherently stochastic network of interconnected pores. The various embodiments disclosed herein avoid these problems inherent in wicked heat pipes.

The table below provides a comparison between wicked and wickless heat pipes.

|  | Wick-type heat pipes | Wickless (CVB) heat pipes |
| --- | --- | --- |
| Manufacturing | The fabrication consists of added steps and complexity due to the varied nature of the wicks and inserts needed to keep them in place (adhered to the wall of the pipe). | These are much simpler to fabricate as there are no wick structures to insert or adhere to the walls of the heat pipe. |
| Performance | The performance can be better than the wickless type as it can avoid dry out for longer heat loads with aided capillary flow to the heated end. The combination of the wick structure and material would determine performance. | Performance could be hindered on high heat loads if capillary pumping head drops off (too long of a bubble). The size of the Constrained Vapor Bubble would drive the performance and a when compared to similar sized wick type pipe, the ease of manufacturability and longevity of this type of heat pipe wins. |
| Simplicity | Wick structure and material of the wick can be complex and tough to maintain. Wicks add to cost of the device. | Lack of a material wick makes this simpler and lighter to use. Also, less expensive to build. |
| Challenges | Longevity of wicks is a challenge, cost incurred due to addition of a wick is another challenge. PCB manufacturers do not have a standard process for inserting the wicks. Nucleate boiling within wick structure creates problems. | Long dry-out lengths at high heat loads for large bubble sizes creates challenges. Maintaining symmetry of capillary flow in a horizontal direction on Earth could be an issue. |

Figure 4B:
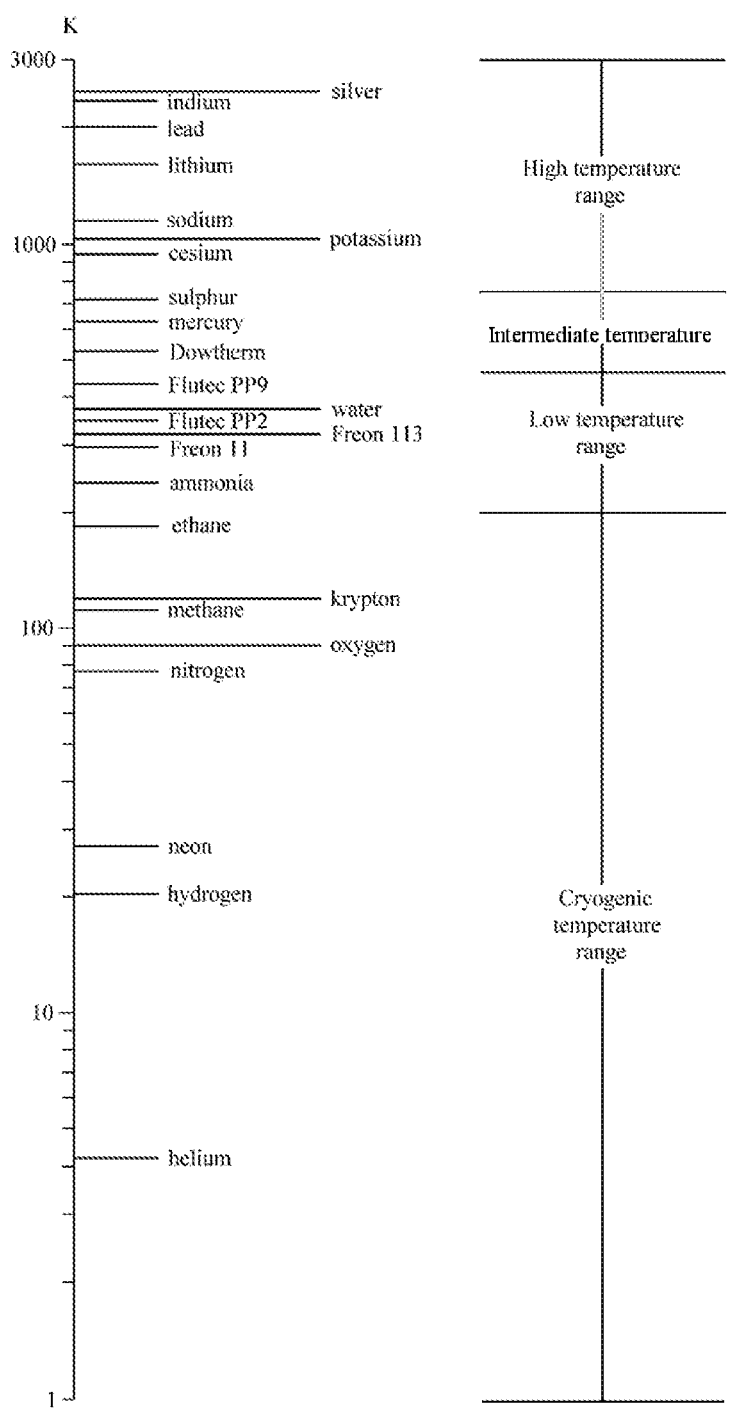
FIG. 4B illustrates a logarithmic temperature scale of operating temperature ranges of various working fluids.

The tables below and the scale shown in FIG. 4B provide a summary of fluid possibilities and material compatibility for various operating temperature ranges for the CVB wickless heat pipes of example embodiments.

TABLE 1

Working fluids and temperature ranges of heat pipes.

| Working Fluid | Melting Point, K at 1 atm | Boiling Point, K at 1 atm | Useful Range, K |
| --- | --- | --- | --- |
| Helium | 1.0 | 4.21 | 2-4 |
| Hydrogen | 13.8 | 20.38 | 14-31 |
| Neon | 24.4 | 27.09 | 27-37 |
| Nitrogen | 63.1 | 77.35 | 70-103 |
| Argon | 83.9 | 87.29 | 84-116 |
| Oxygen | 54.7 | 90.18 | 73-119 |
| Methane | 90.6 | 111.4 | 91-150 |
| Krypton | 115.8 | 119.7 | 116-160 |
| Ethane | 89.9 | 184.6 | 150-240 |
| Freon 22 | 113.1 | 232.2 | 193-297 |
| Ammonia | 195.5 | 239.9 | 213-373 |
| Freon 21 | 138.1 | 282.0 | 233-360 |
| Freon 11 | 162.1 | 296.8 | 233-393 |
| Pentane | 143.1 | 309.2 | 253-393 |
| Freon 113 | 236.5 | 320.8 | 263-373 |
| Acetone | 180.0 | 329.4 | 273-393 |
| Methanol | 175.1 | 337.8 | 283-403 |
| Flutec PP2 | 223.1 | 349.1 | 283-433 |
| Ethanol | 158.7 | 351.5 | 273-403 |
| Heptane | 182.5 | 371.5 | 273-423 |
| Water | 273.5 | 373.1 | 303-550 |
| Toluene | 178.1 | 383.7 | 323-473 |
| Flutec PP9 | 203.1 | 433.1 | 273-498 |
| Naphthalene | 353.4 | 490 | 408-623 |

TABLE 1-continued

Working fluids and temperature ranges of heat pipes.

| Working Fluid | Melting Point, K at 1 atm | Boiling Point, K at 1 atm | Useful Range, K |
| --- | --- | --- | --- |
| Dowtherm | 285.1 | 527.0 | 423-668 |
| Mercury | 234.2 | 630.1 | 523-923 |
| Sulphur | 385.9 | 717.8 | 530-947 |
| Cesium | 301.6 | 943.0 | 723-1173 |
| Rubidium | 312.7 | 959.2 | 800-1275 |
| Potassium | 336.4 | 1032 | 772-1273 |
| Sodium | 371.0 | 1151 | 873-1473 |
| Lithium | 453.7 | 1615 | 1273-2073 |
| Calcium | 1112 | 1762 | 1400-2100 |
| Lead | 600.6 | 2013 | 1670-2200 |
| Indium | 429.7 | 2353 | 2000-3000 |
| Silver | 1234 | 2485 | 2073-2573 |

TABLE 2

Generalized results of experimental compatibility tests

| Working fluid | Compatible Material | Incompatible Material |
| --- | --- | --- |
| Water | Stainless Steel[a], Copper, Silica, Nickel, Titanium | Aluminum, Inconel |
| Ammonia | Aluminum, Stainless Steel, Cold Rolled Steel, Iron, Nickel | |
| Methanol | Stainless Steel, Iron, Copper, Brass, Silica, Nickel | Aluminum |
| Acetone | Aluminum, Stainless Steel, Copper, Brass, Silica | |
| Freon-11 | Aluminum | |
| Freon-21 | Aluminum, Iron | |
| Freon-113 | Aluminum | |
| Heptane | Aluminum | |
| Dowtherm | Stainless Steel, Copper, Silica | |
| Lithium | Tungsten, Tantalum, Molybdenum, Niobium | Stainless Steel, Nickel, Inconel, Titanium |
| Sodium | Stainless Steel, Nickel, Inconel, Niobium | Titanium |
| Cesium | Titanium, Niobium, Stainless Steel, Nickel-based superalloys | |
| Mercury | Stainless Steel[b] | Molybdenum, Nickel, Tantalum, Inconel, Titanium, Niobium |
| Lead | Tungsten, Tantalum | Stainless Steel, Nickel, Inconel, Titanium, Niobium |
| Silver | Tungsten, Tantalum | Rhenium |

[a]Sensitive to cleaning; [b]with Austenitic SS

Figure 5:
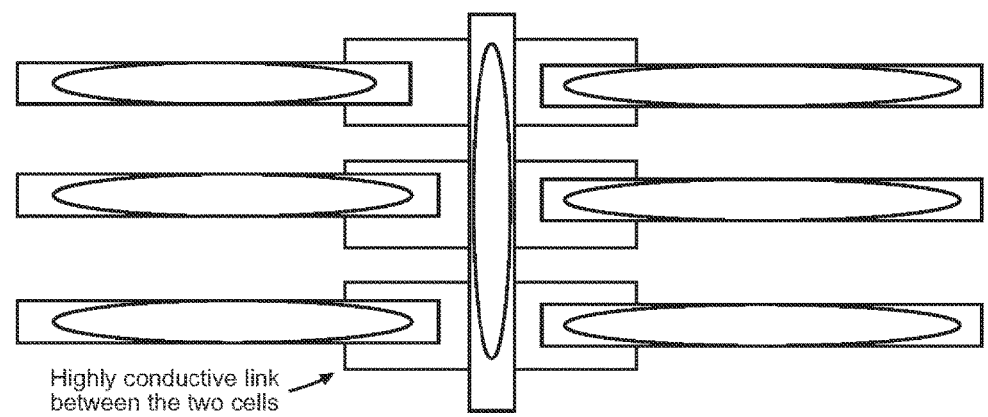
FIG. 5 illustrates some of the techniques with which the embodiments described herein overcome some of the challenges.

FIG. 5 illustrates some of the techniques with which the embodiments described herein overcome some of the challenges. In some circumstances, the wickless CVB heat pipe can also encounter some implementation issues. In particular, a lack of wettability of liquid to the surface, a high heat load, and opposing gravity can cause longer dry out lengths where the liquid loses contact with the wall and degrades the CVB's performance. However, the embodiments described herein overcome these challenges in a variety of ways including by use of one or more of the techniques listed below and shown in FIG. 5:

Array (daisy chaining) of shorter CVB cells can be used to increase the total CVB length. In this embodiment, the condenser for one cell acts as the evaporator of an adjacent cell;

Cross patterns of CVB arrays can make them work in any gravity orientation;

Using a highly wettable liquid with a high energy surface can decrease dry outs;

and

Micro-sized piezo devices can be used to help increase capillary lengths.

Figure 6:
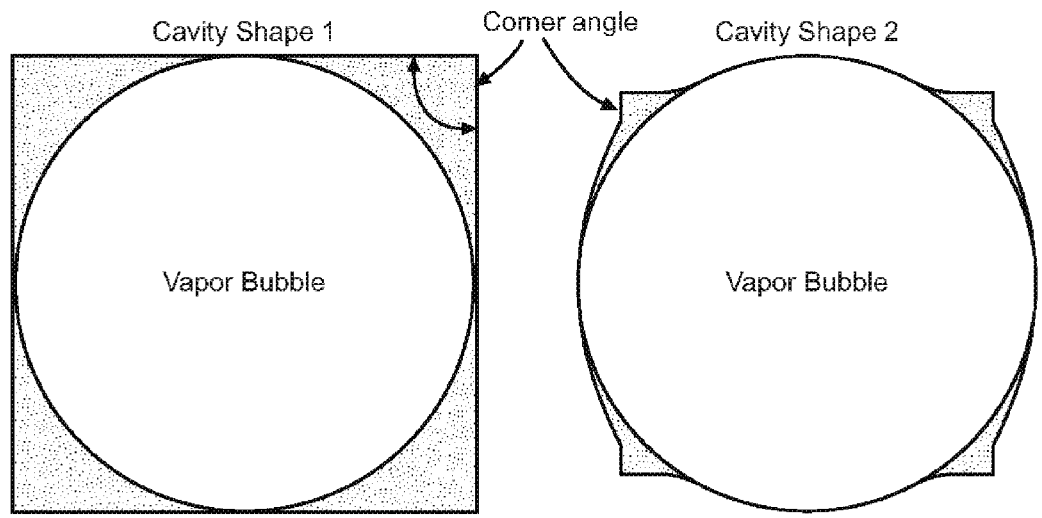
FIG. 6 illustrates example embodiments showing novel cavity shapes.

The wickless CVB heat pipe of various example embodiments is designed with regard to several important parameters as listed below:

Gravity impact
Fin effectiveness
Dry out lengths
Dimensions and shapes
Heat transfer rates
Liquid vapor interface
Surface tension
Wettability FIG. 6 illustrates example embodiments showing novel cavity shapes. Liquid rising in the capillary formed by the vapor bubble and cavity walls can be manipulated by use of various cavity shapes. Through innovative cavity shapes as shown in FIG. 6, CVB capillary lengths can be tuned for the same vapor bubble diameter. Geometries that create smaller corner angles with effectively smaller hydraulic radii can lead to larger capillary lengths. Tools can help to predict approximate capillary lengths for different corner areas, bubble diameters, contact angles, and different fluid properties. This can help to tune the cavity dimensions per the available surface dimensions and fluids in products.

Figure 7:
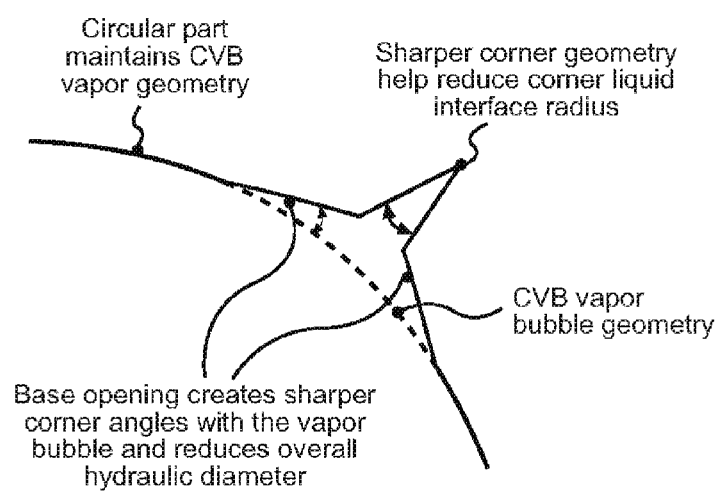
FIG. 7 illustrates an example embodiment showing the idea behind the new cavity shapes.

FIG. 7 illustrates an example embodiment showing the idea behind the new cavity shapes. The circular part of the shape maintains CVB vapor geometry. Sharper corner geometry help reduce the corner liquid interface radius. The base opening creates sharper corner angles with the vapor bubble and reduces overall hydraulic diameter.

Figure 8:
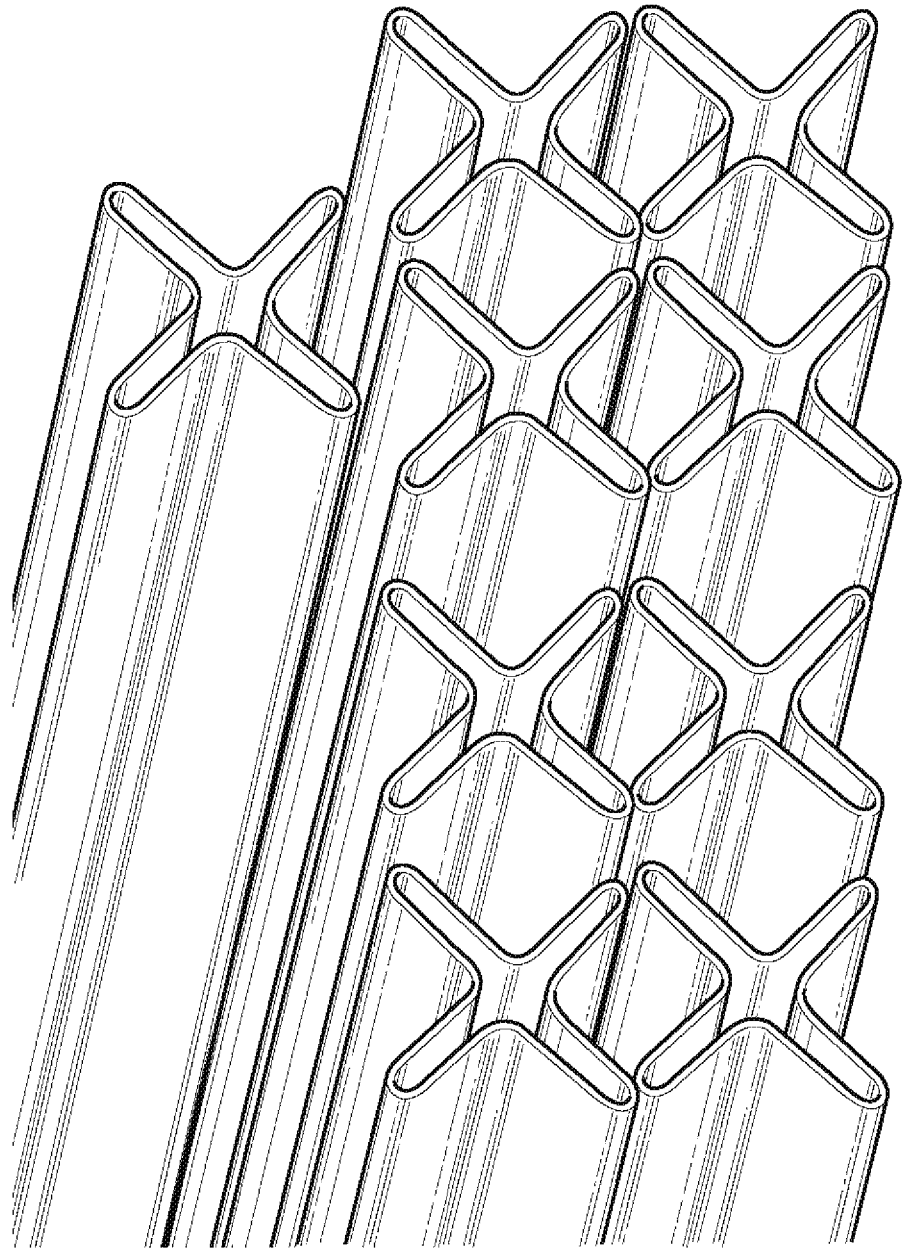
FIG. 8 illustrates an example embodiment showing the manufacturability of the new cavity shapes.

FIG. 8 illustrates an example embodiment showing the manufacturability of the new cavity shapes. In various example embodiments, non-standard/novel shapes can include flowers, octagons, stars, triangles, and the like. Most metal manufacturers can make it (as long as it's under 2" in diameter), which is ideal for micro heat pipes. Like standard shapes, the tubing is formed and welded into the "mother" round shape before it can be finalized. In the case of the x-shaped tubing as shown in FIG. 8, the tubing went from round to square, and then was formed into the "x" shape. Uncommon shapes may go through many different shaping processes to meet the client's requirements. Different techniques used include welding, laser cutting, injection molding, etc. For non-metallic tube material, one can use chemical etch or heat shaping.

Figure 9:
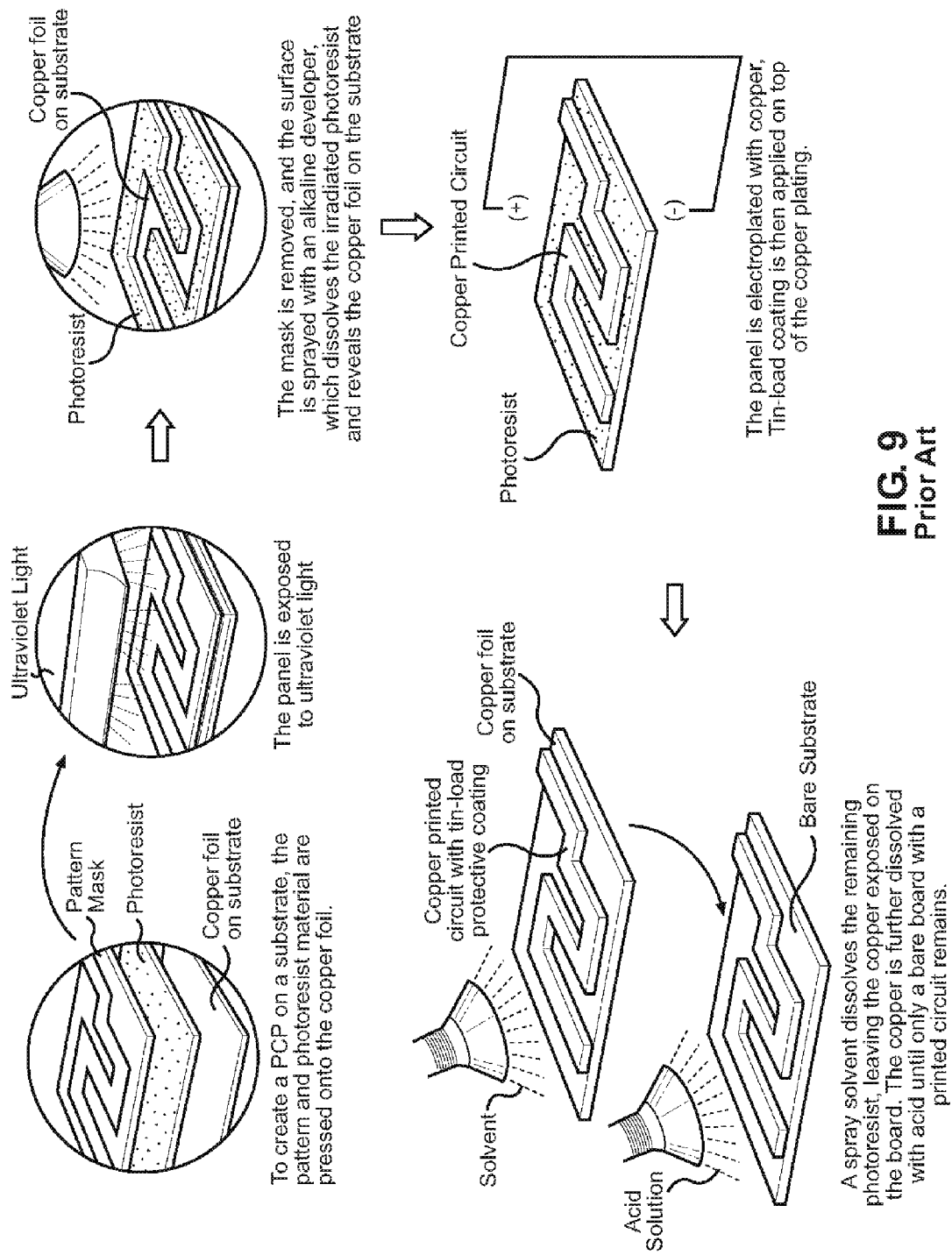
FIG. 9 illustrates a typical Printed Circuit Board (PCB) fabrication process.
Figure 10:
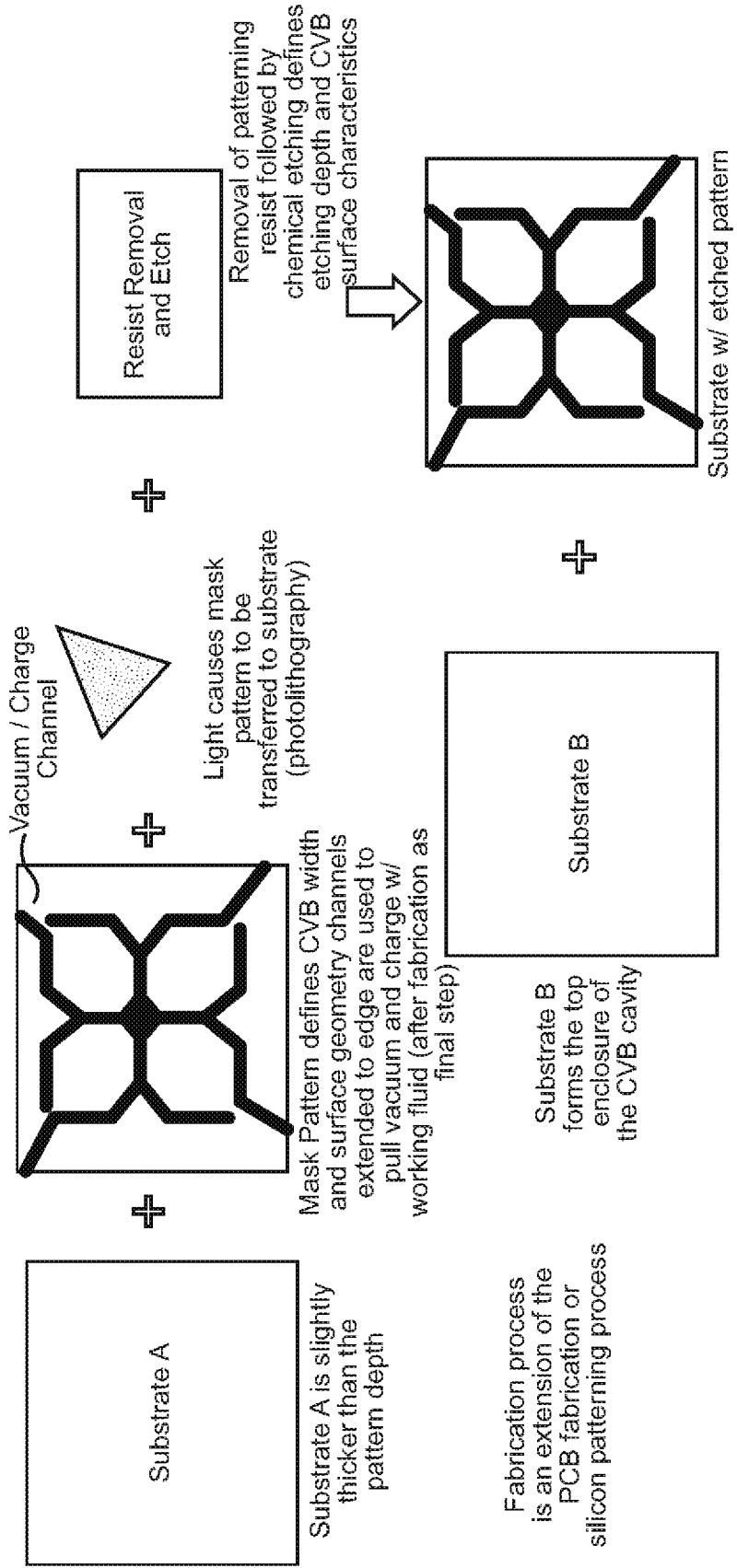
FIG. 10 illustrates an example embodiment of a CVB heat pipe fabrication process using chemical etching.
Figure 11:
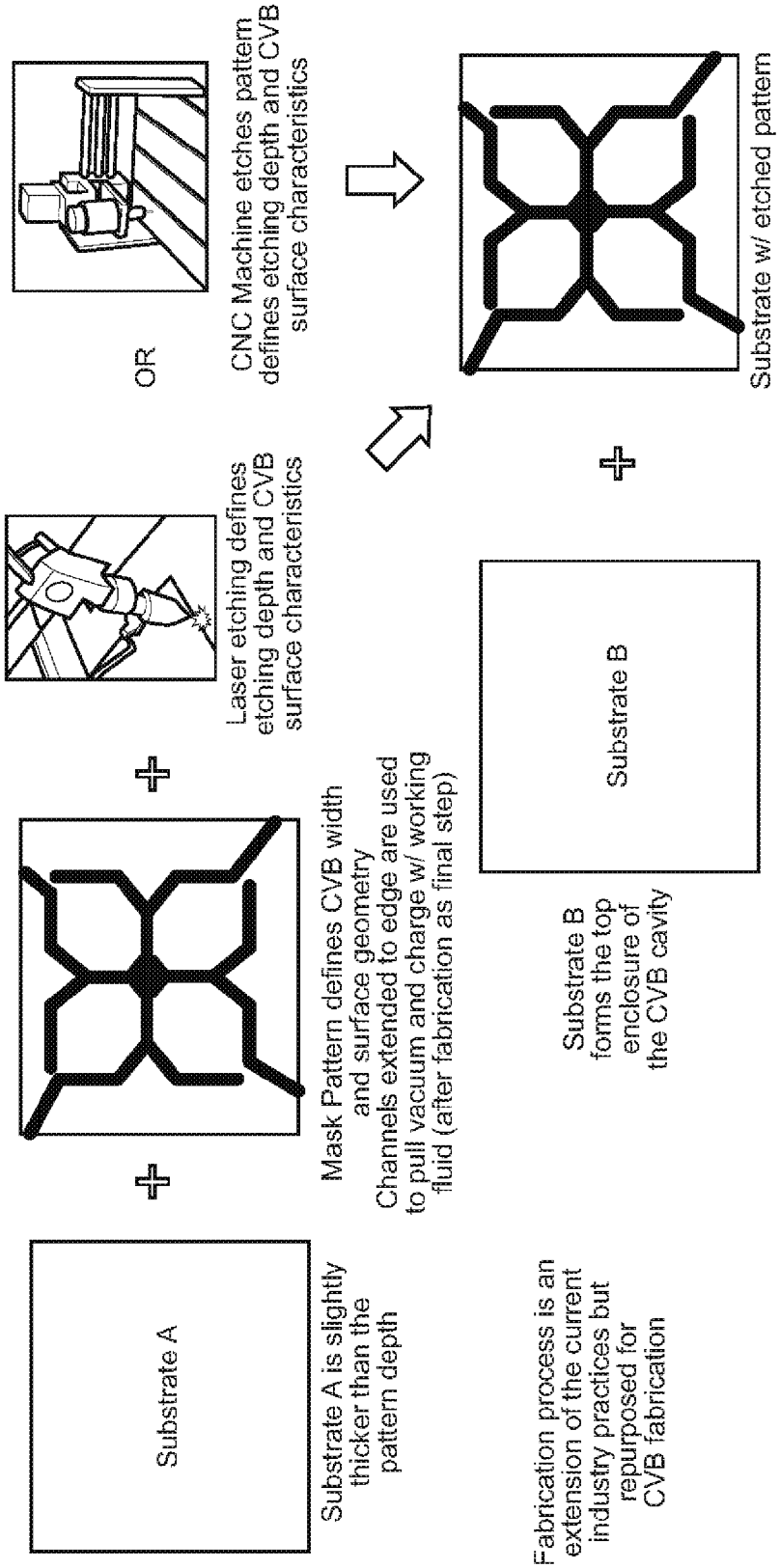
FIG. 11 illustrates an example embodiment of a CVB heat pipe fabrication process using laser/mechanical subtraction.
Figure 12:
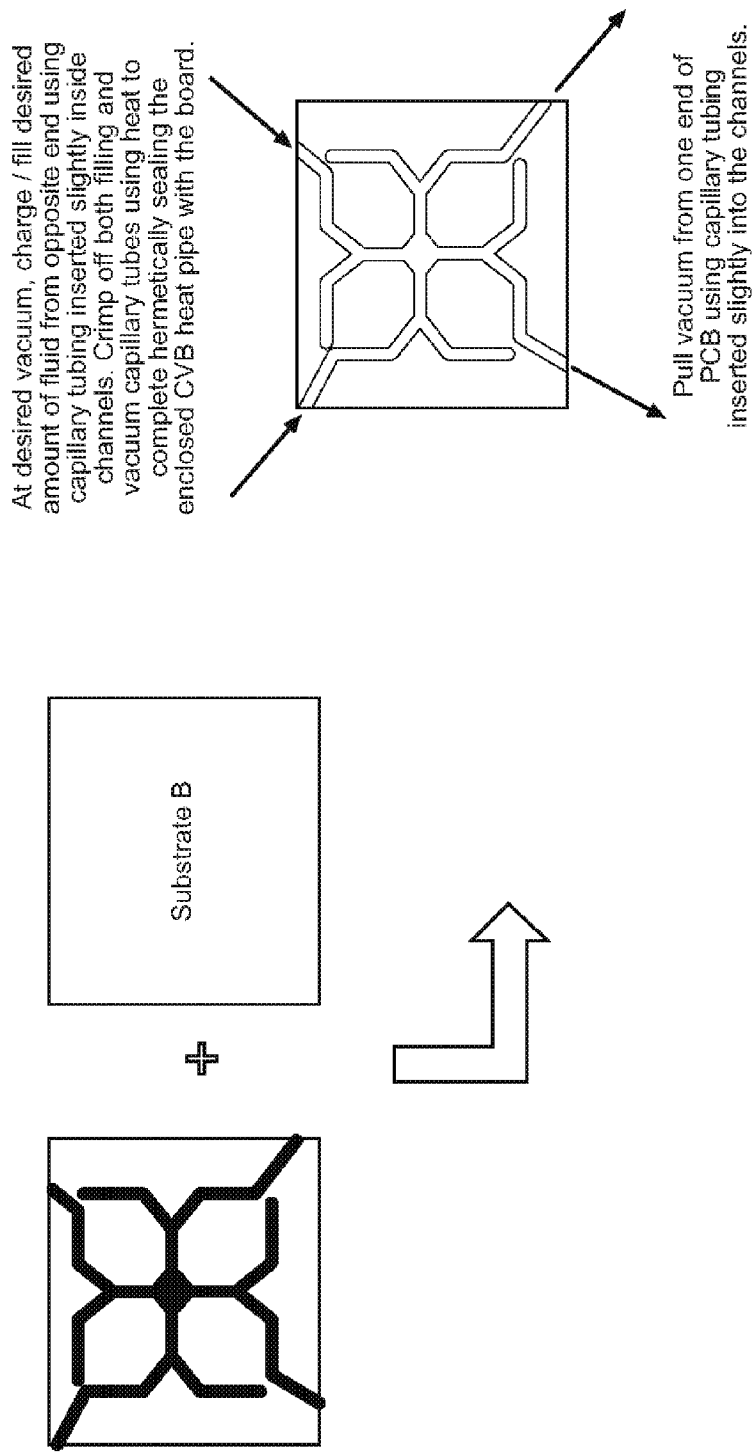
FIG. 12 illustrates an example embodiment of a CVB charging process using vacuum, fill, and seal.

FIG. 9 illustrates a typical Printed Circuit Board (PCB) fabrication process. Such processes can be modified and applied to the fabrication of CVB heat pipes. FIG. 10 illustrates an example embodiment of a CVB heat pipe fabrication process using chemical etching. In general, the CVB heat pipe fabrication process of an example embodiment is an extension of the PCB fabrication or silicon patterning process. FIG. 11 illustrates an example embodiment of a CVB heat pipe fabrication process using laser/mechanical subtraction. FIG. 12 illustrates an example embodiment of a CVB charging process using vacuum, fill, and seal.

Figure 13:
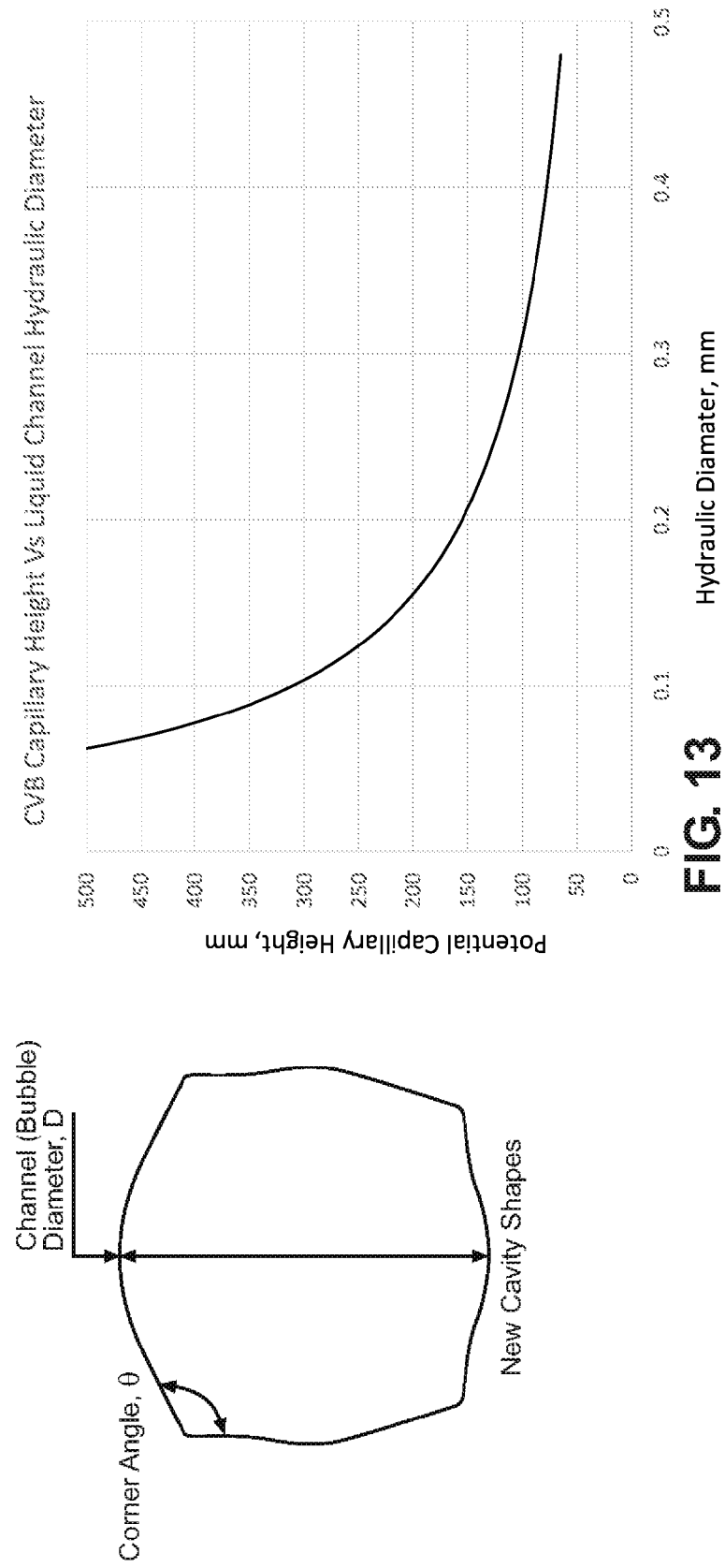
FIG. 13 illustrates an example embodiment showing capillary heights for CVB for different cavity shapes.

FIG. 13 illustrates an example embodiment showing capillary lengths for CVB heat pipes for different cavity shapes. The corner angles of the cavity can be modified and adjusted to determine a corresponding capillary length. A tool can help to predict an approximate capillary length for different corner angles, channel diameters, contact angles, and different fluid properties. This can help to tune the cavity dimensions per the available surface dimensions and fluids in products.

Figure 14:
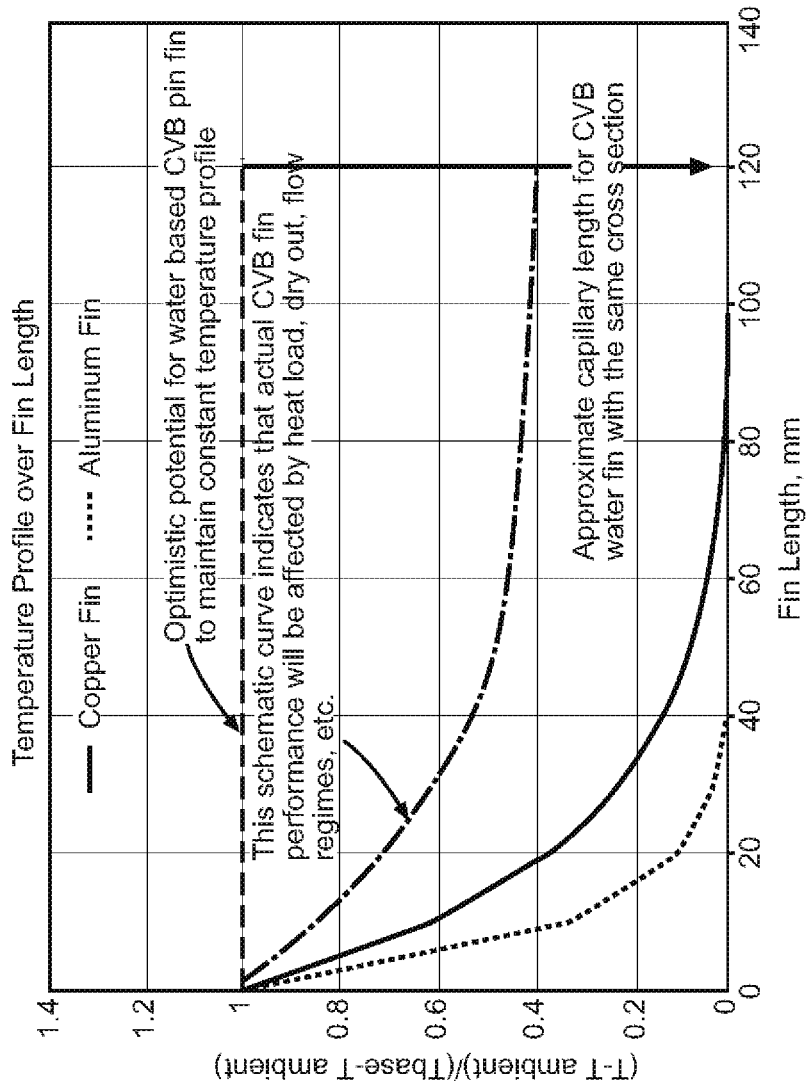
FIG. 14 illustrates a temperature comparison between a CVB fin and a metal fin.

FIG. 14 illustrates a temperature comparison between a CVB fin and a metal fin. The basic calculations show a potential for a high temperature profile for a longer length CVB fin. Higher temperatures over the fin result in higher heat transfer. This indicates the potential for taller, thinner, and efficient fins with the CVB embodiments described herein. The CVB embodiments described herein avoid dry outs and maximize two phase heat transfer for a given fin length. Heat sink based on CVB fins can be expected to be lighter as compared to non-CVB based heat sinks for similar thermal performance.

Figure 15:
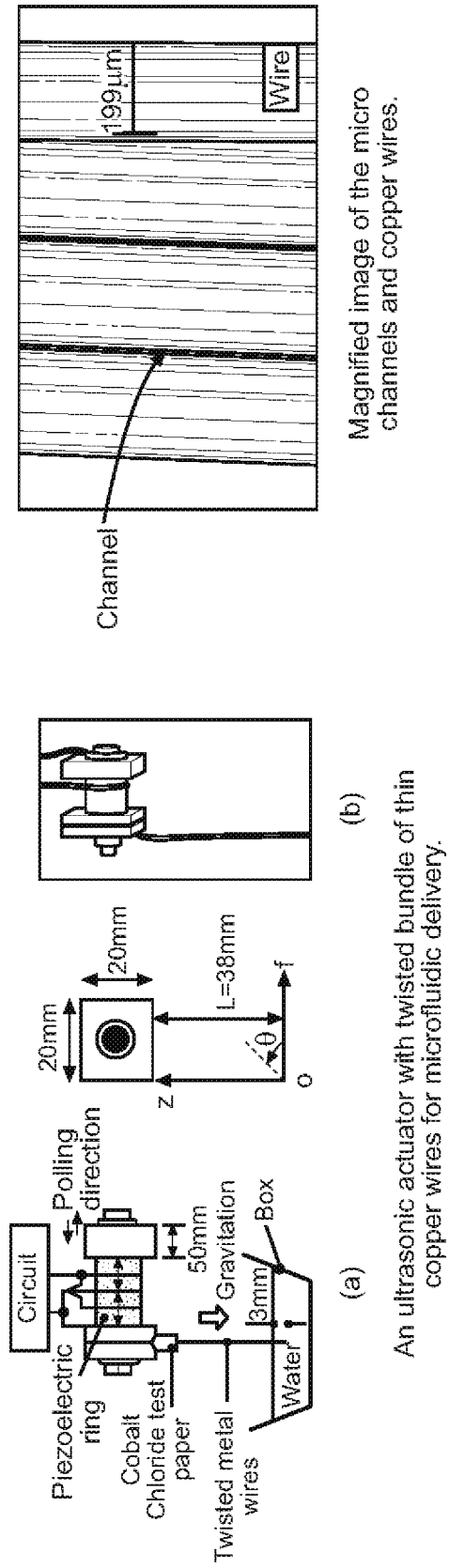
FIGS. 15 through 17 illustrate the effects of ultrasonic on capillary forces as discussed in the prior art.
Figure 16:
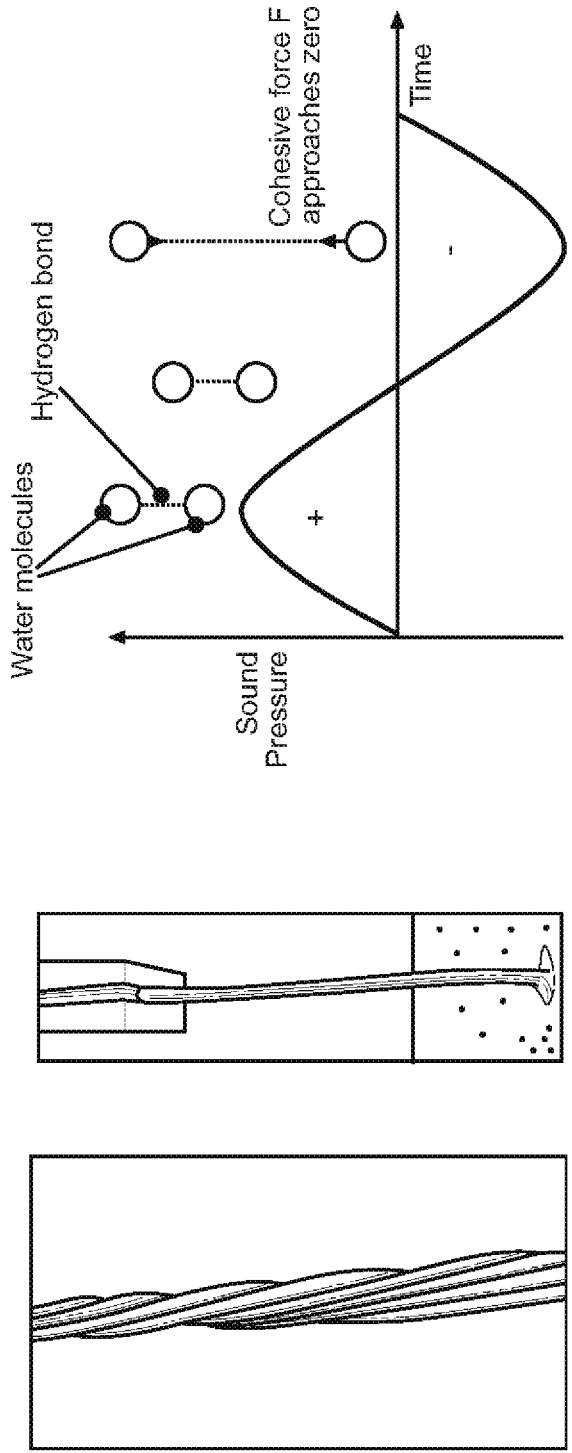
Figure 17:
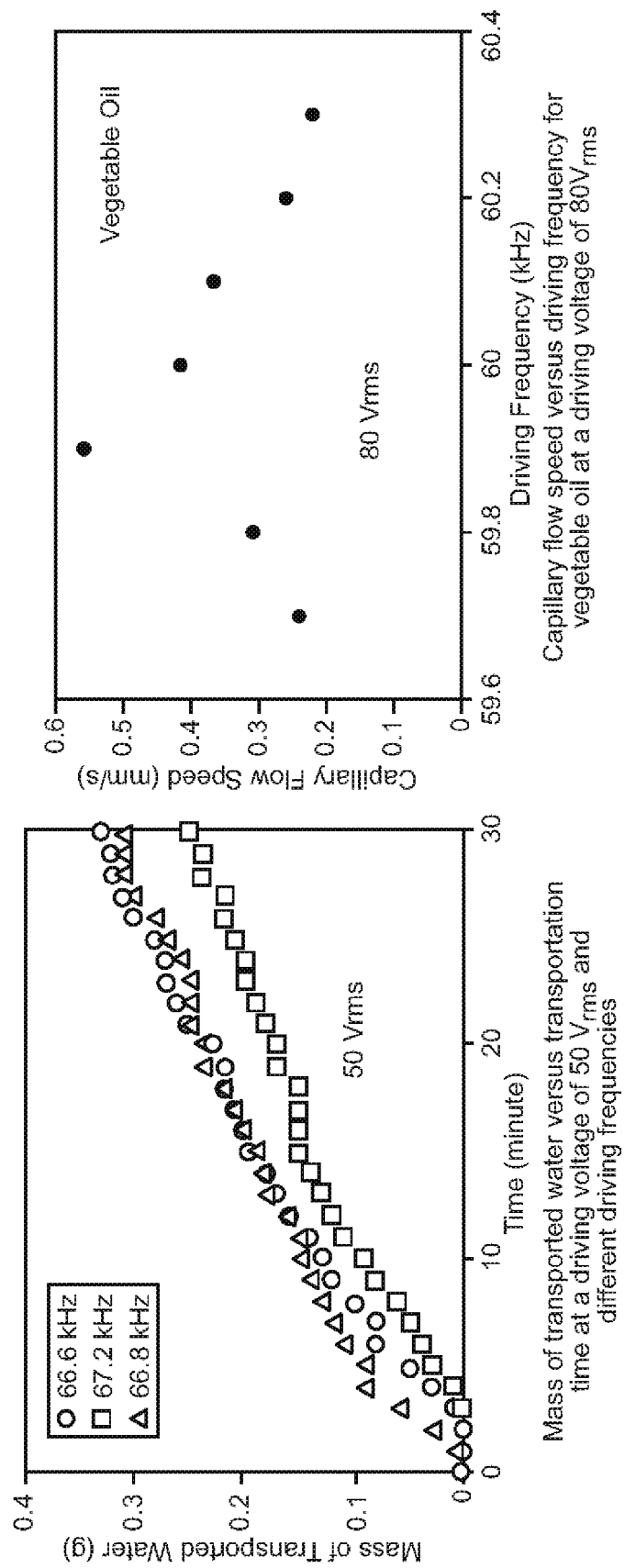

FIGS. 15 through 17 illustrate the effects of ultrasonic on capillary forces through data published in the prior art. The prior art is referenced here only to indicate that capillary force can be influenced through external means besides geometry.

Figure 18:
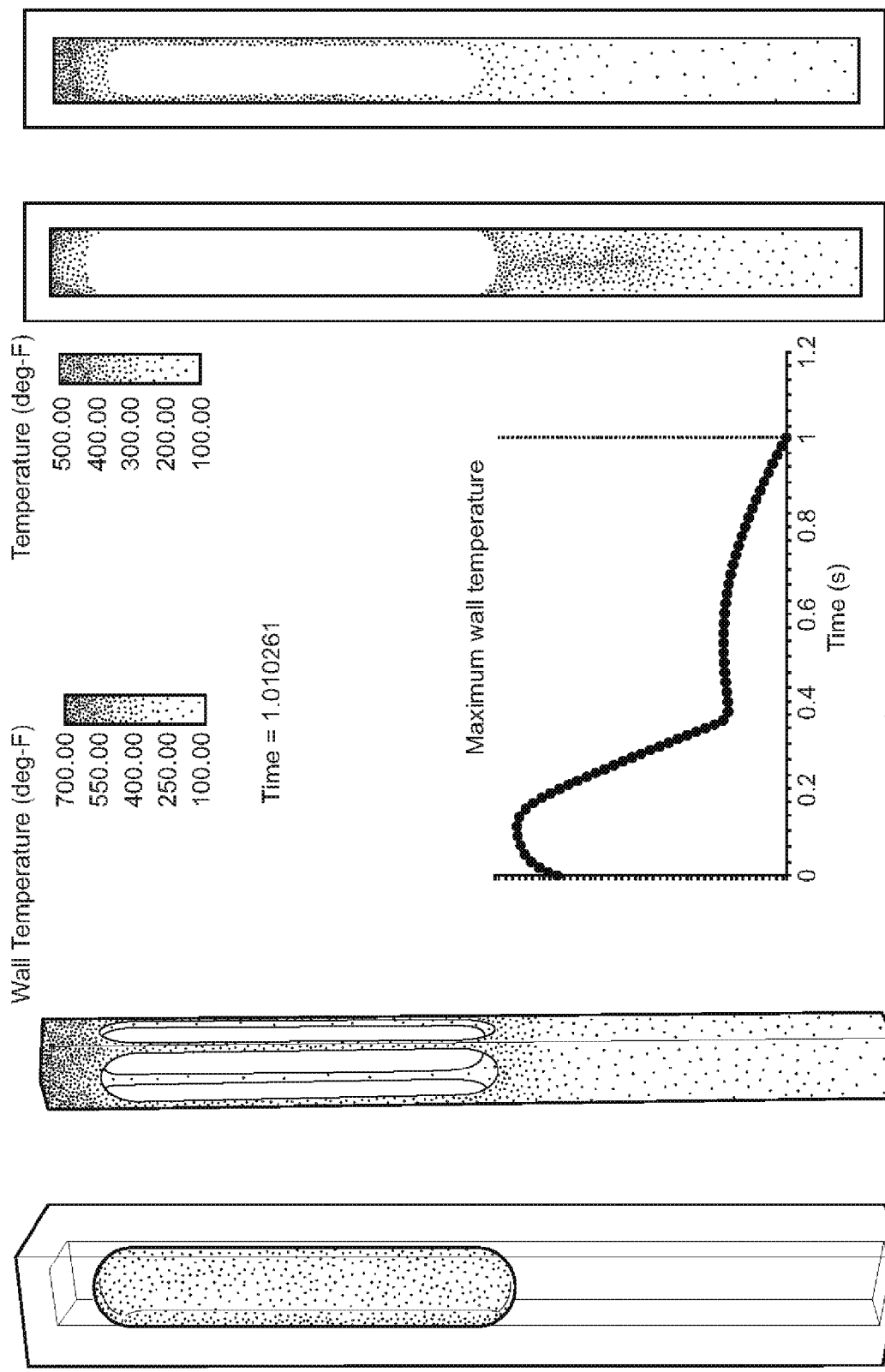
FIG. 18 illustrates the results of operation with an example embodiment as shown with a prior art simulation tool (e.g., Flow3D simulations)

FIG. 18 illustrates the results of the operation of an example embodiment as shown with a prior art simulation tool (e.g., Flow3D simulations). The Flow3D simulations show very promising thermal results and indicate how simulating this complex phenomenon can work with new and sophisticated tools. The simulation can be tuned and used to our advantage to yield sensitivity analysis.

Figure 19:
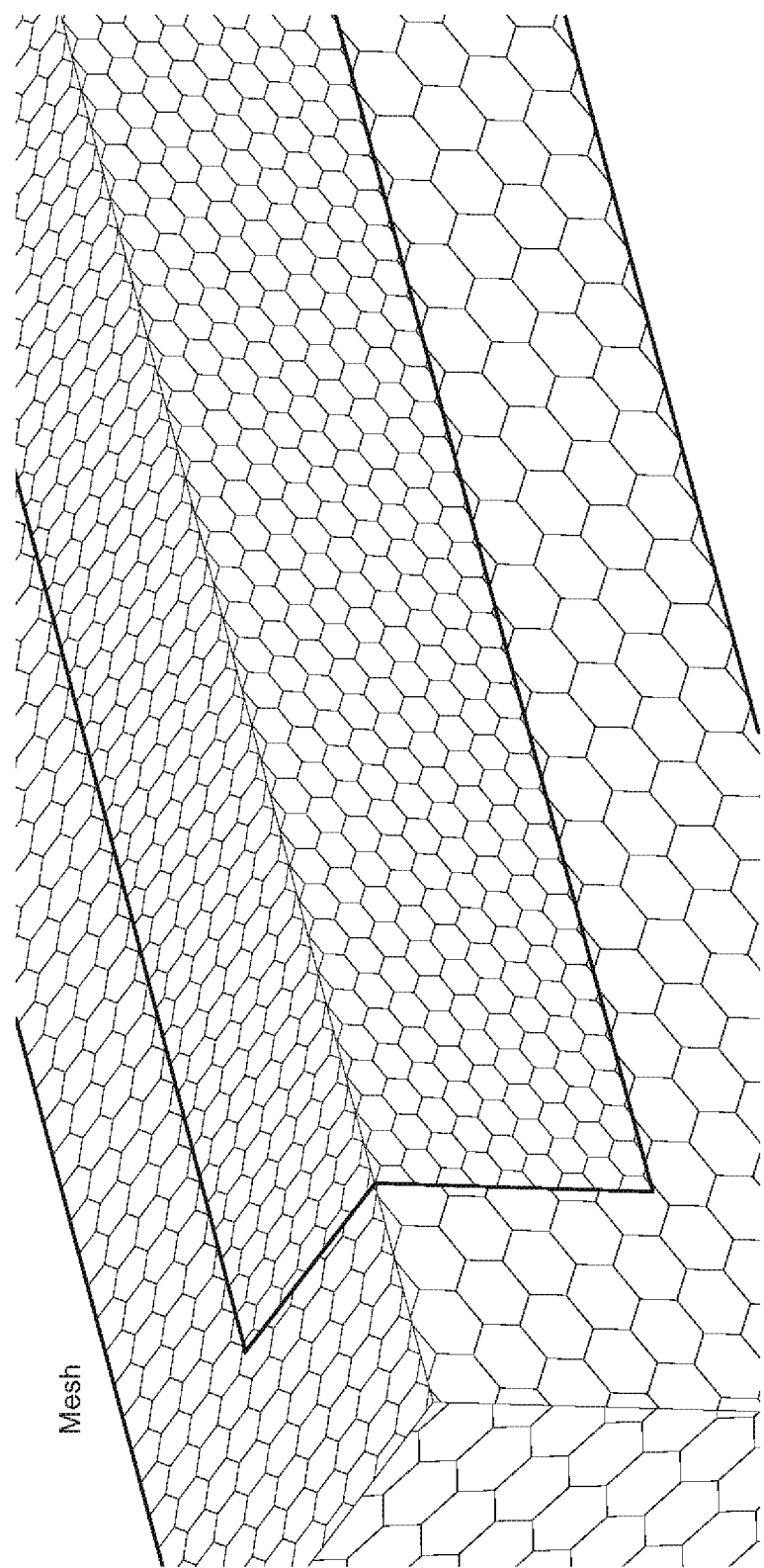
FIG. 19 illustrates an example embodiment of a three-dimensional shape embedded with a computational mesh of wickless capillary driven heat pipes, shown using a prior art simulation tool.

FIG. 19 illustrates an example embodiment of a three-dimensional shape embedded with a computational mesh of wickless capillary driven heat pipes, shown using a prior art simulation tool.

Figure 20:
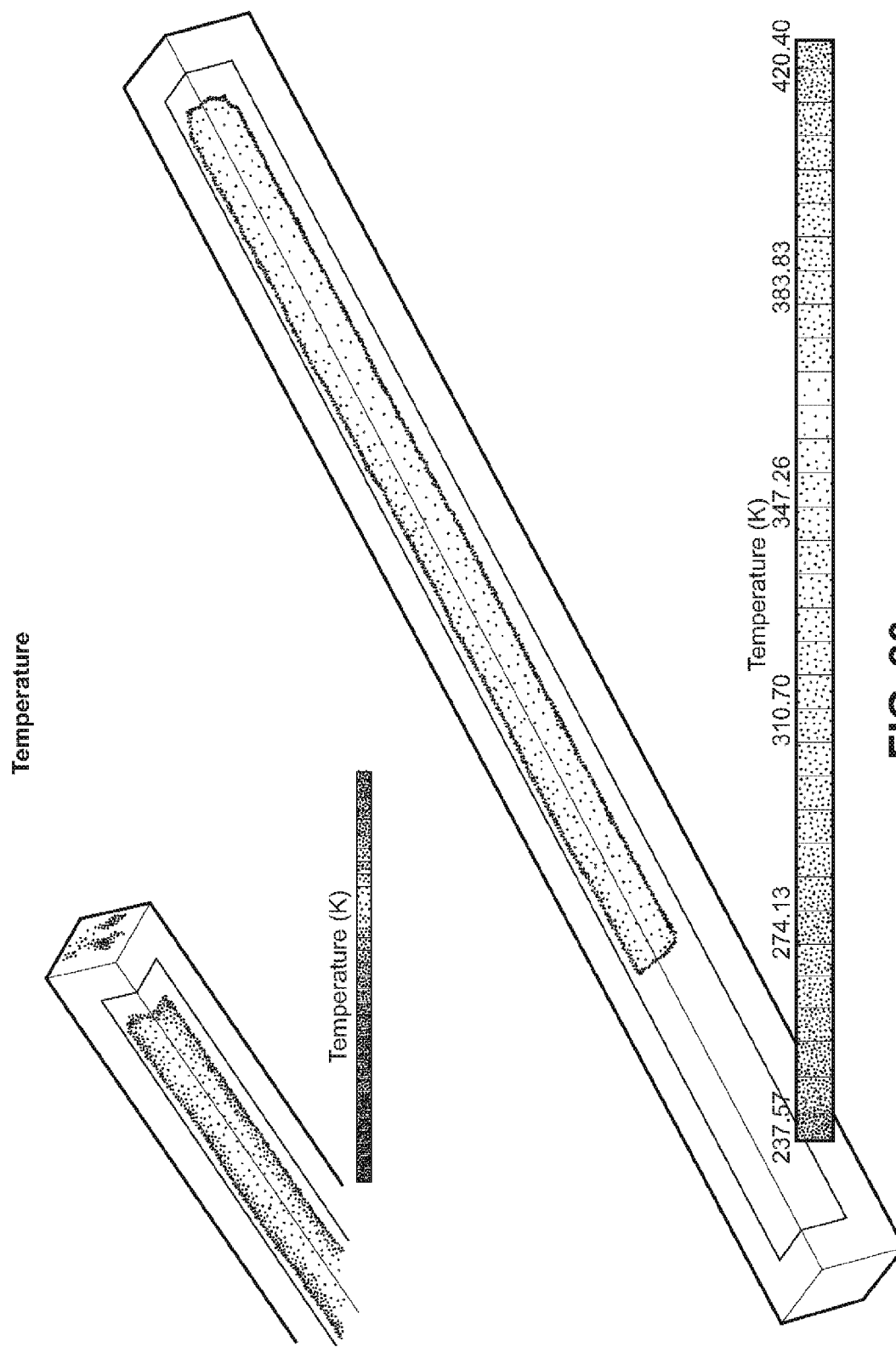
FIG. 20 illustrates an example of the temperature variations in a wickless capillary driven heat pipe of an example embodiment, shown using a prior art simulation tool.

FIG. 20 illustrates an example of the temperature variations in a wickless capillary driven heat pipe of an example embodiment, shown using a prior art simulation tool.

Figure 21:
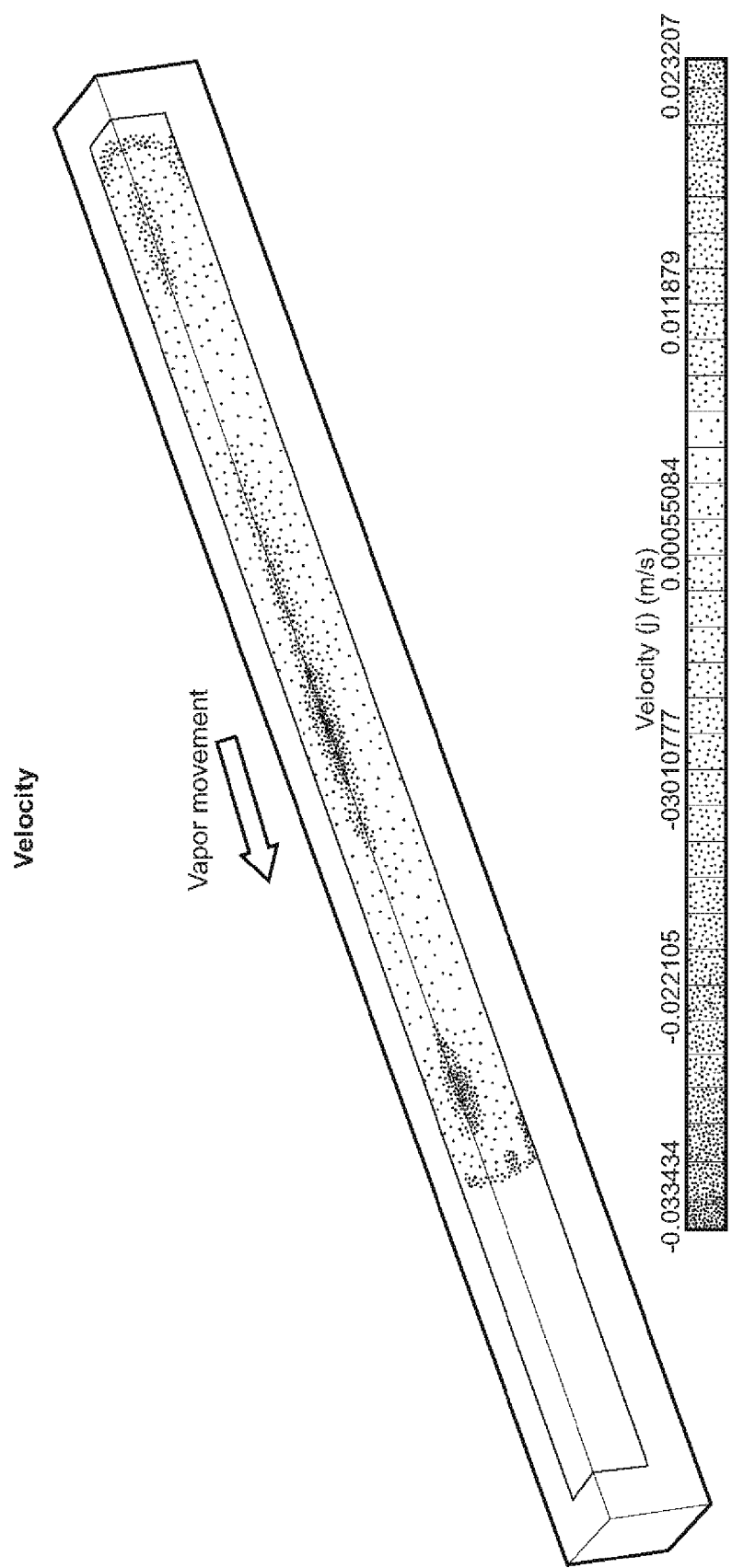
FIG. 21 illustrates an example of the vapor movement velocity variations in a wickless capillary driven heat pipe of an example embodiment, shown using a prior art simulation tool.

FIG. 21 illustrates an example of the vapor movement velocity variations in a wickless capillary driven heat pipe of an example embodiment, shown using a prior art simulation tool.

Figure 22:
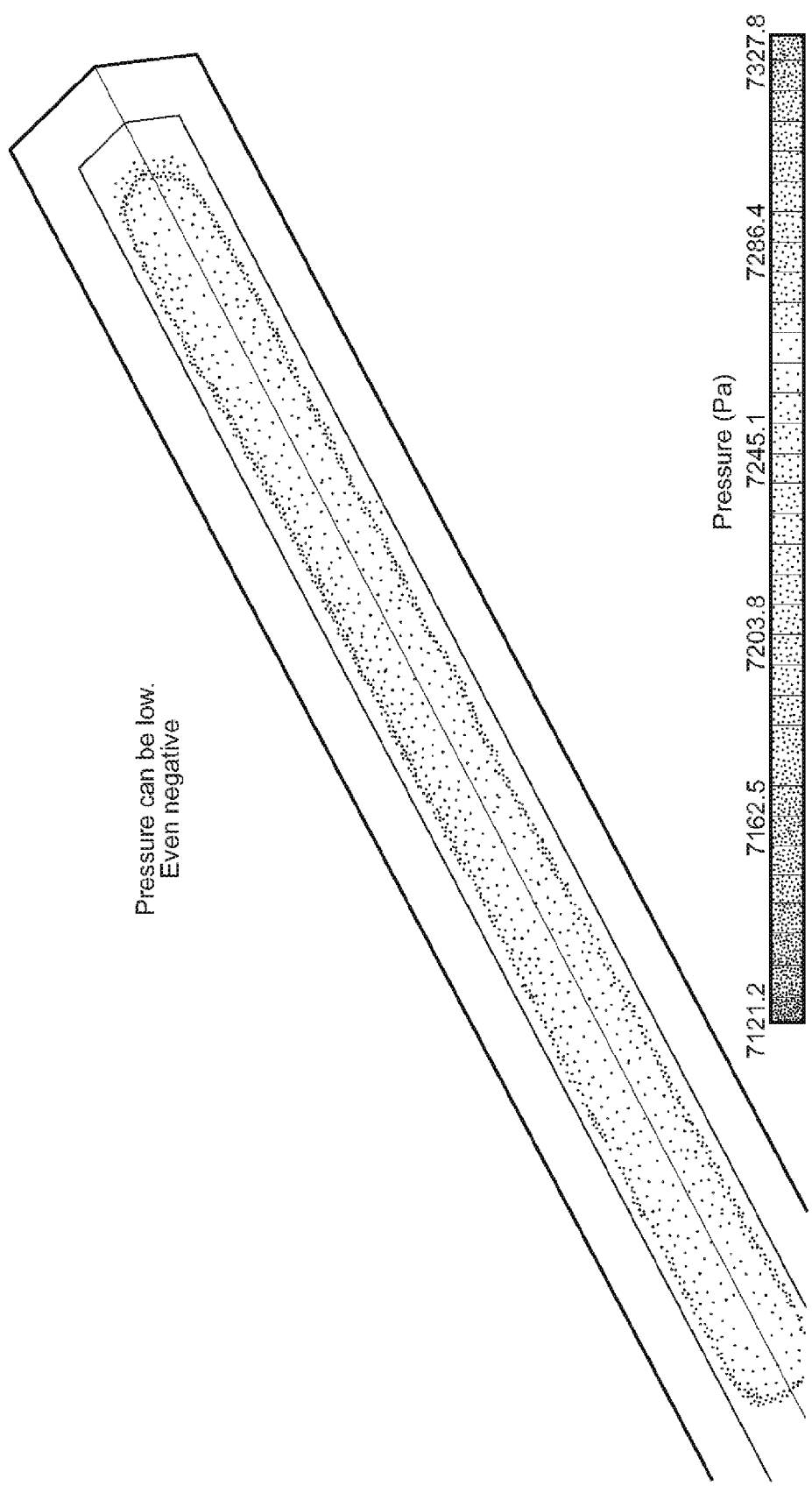
FIG. 22 illustrates an example of the pressure variations in a wickless capillary driven heat pipe of an example embodiment, shown using a prior art simulation tool.

FIG. 22 illustrates an example of the pressure variations in a wickless capillary driven heat pipe of an example embodiment, shown using a prior art simulation tool.

Figure 23:
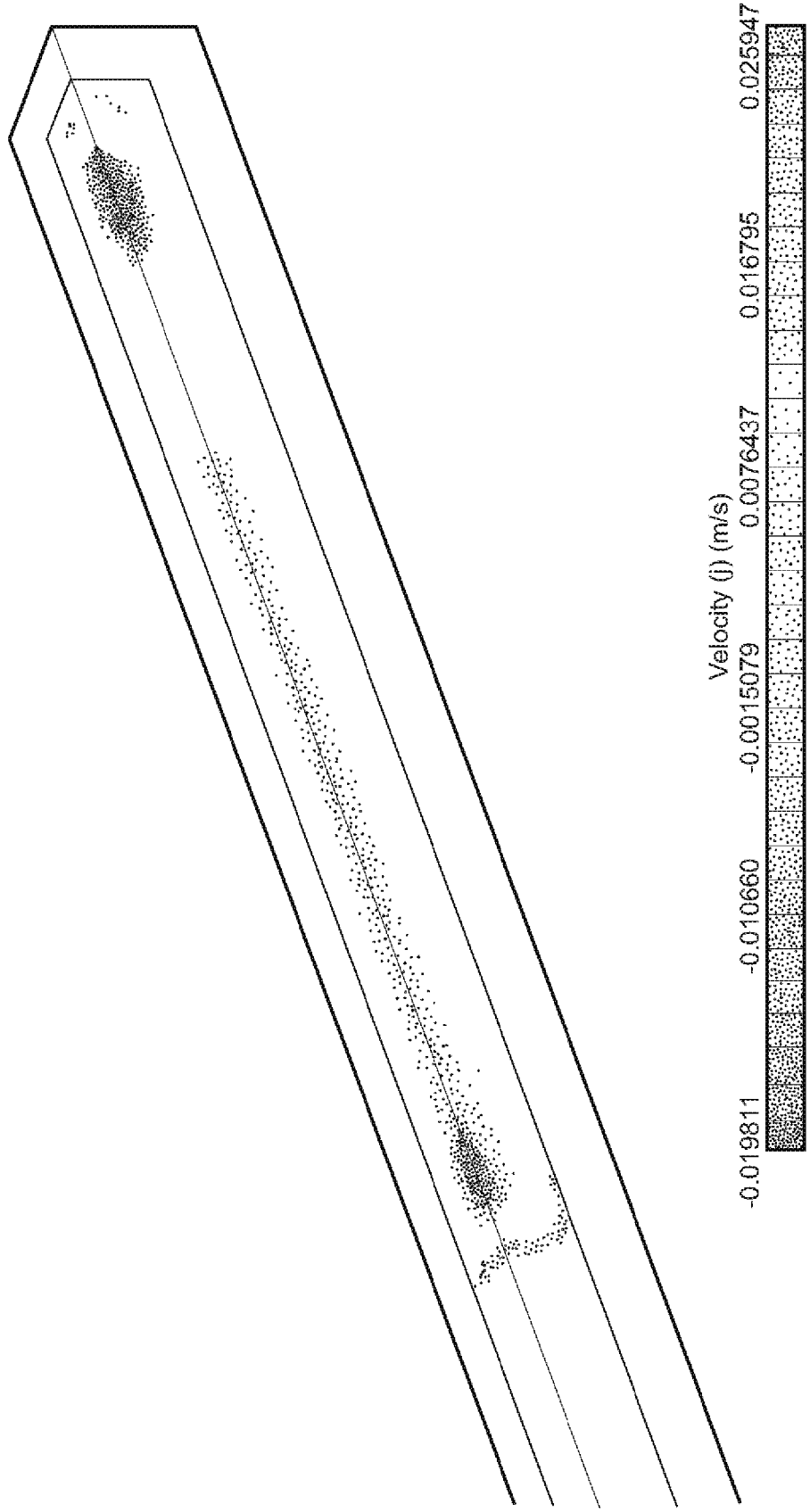
FIG. 23 illustrates an example of the velocity variations in a wickless capillary driven heat pipe of an example embodiment, shown using a prior art simulation tool.

FIG. 23 illustrates an example of the velocity variations in a wickless capillary driven heat pipe of an example embodiment, shown using a prior art simulation tool.

As described above, the wickless CVB heat pipes of the various embodiments can be formed in a variety of shapes and configurations and fabricated in a variety of ways to accommodate a variety of different applications. Some of these applications for various example embodiments are described in more detail below.

Application in Display Devices

Figure 24:
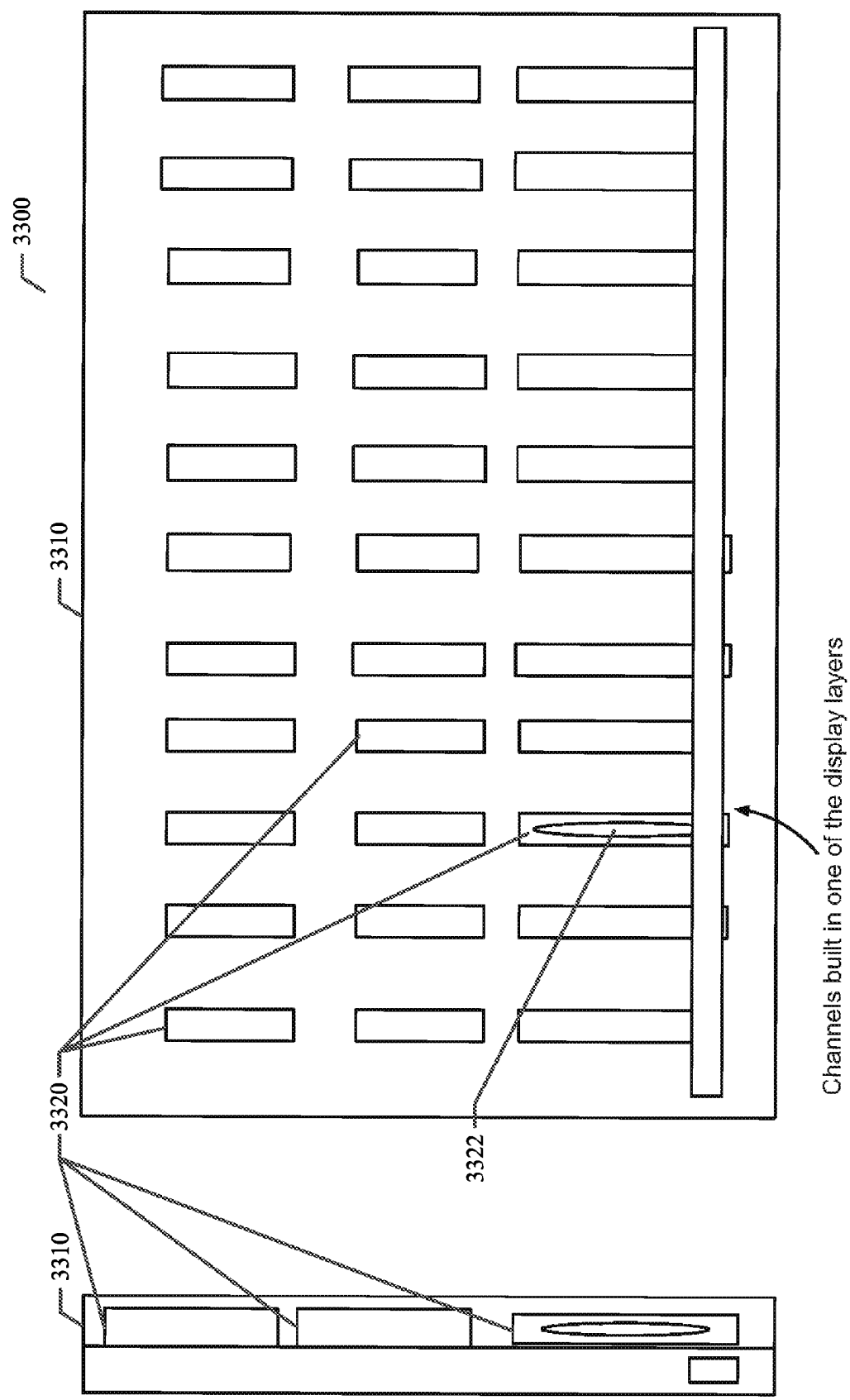
FIG. 24 illustrates an example embodiment of capillary based wickless heat pipe micro-channels integrated into the display light guide of a display device for better thermal management.
Figure 25:
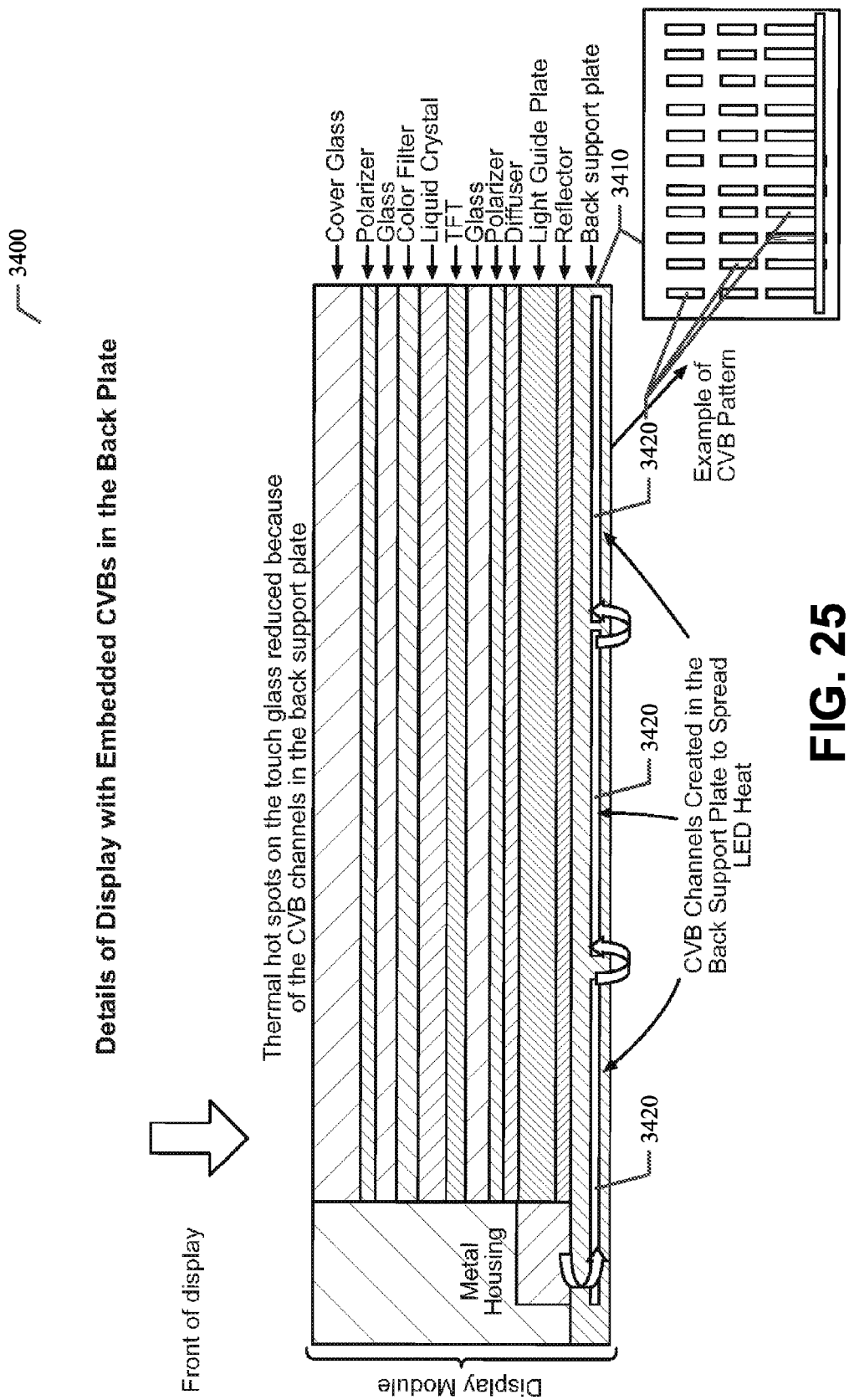
FIG. 25 illustrates an example embodiment of a display device with embedded CVBs in the back plate.

FIG. 24 illustrates an example embodiment 3300 of capillary based wickless heat pipe micro-channels 3320 integrated or embedded into the display light guide 3310 or other layer of a display device for better thermal management. FIG. 25 illustrates an example embodiment 3400 of a display device with embedded capillary based wickless heat pipe micro-channels 3420 in the back plate layer 3410 of the display device. In the various example embodiments, these techniques can improve the thermal characteristics of a display device. As well-known to those of ordinary skill in the art, conventional display devices including computing device monitors, television monitors, lighted display panels, and the like are often manufactured in a modular fashion with a plurality of stacked layers that, in combination, present a visual image to a viewer when in operation. The plurality of stacked display device layers are typically fabricated from one or more substrates. FIG. 25 illustrates an example embodiment of a display device with such a combination of multiple layers. FIG. 24 illustrates an example embodiment of one such layer of the display device—the display light guide layer or the display light guide 3310. As described in more detail below, one or more of the layers of the display device can be modified to include capillary based wickless heat pipes integrated or embedded into one or more layers of a display device for better thermal management.

Given the typical method of manufacturing display devices in a modular fashion with a plurality of stacked layers, these layers, which can contain heat-generating electronic devices, are subject to the build-up of excess heat generated by the heat-generating electronic devices of the one or more layers. Referring again to FIG. 24, to counteract this heat build-up on the display device layer 3310 and/or adjacent display device layers, the example embodiment provides in-built channels 3320 in the display device layer 3310, created in the display device layer fabrication process, to remove the excess heat from portions of the display device layer 3310 where high levels of excess heat are present, and to transfer the heat to the sides of the display device layer 3310 by operation of wickless capillary driven heat pipes 3322 inserted, integrated, or otherwise embedded into the in-built channels 3320. The structure, fabrication, and operation of the embedded wickless capillary driven heat pipes 3322 is described in detail above. For example, FIGS. 9 through 12 described above detail various processes for the fabrication of embedded wickless capillary driven heat pipes in a substrate, such as a display device layer, a display device light guide, a display device back plate, or the like. In an example embodiment, the wickless capillary driven heat pipes 3322 can be embedded into a separate layer of the substrate. For example, a side or edge view of the display device layer 3310 shown in FIG. 24 illustrates the fabrication of the in-built channels 3320 and the wickless capillary driven heat pipes 3322 embedded therein. Because the wickless capillary driven heat pipes 3322 are embedded into the substrate of the display device layer 3310, the wickless capillary driven heat pipes 3322 can draw heat from the surrounding substrate and transfer the heat to other portions of the display device layer 3310 by operation of the fluid and air bubble within each wickless capillary driven heat pipe 3322 as described above. As shown in FIG. 24, the size and orientation of the in-built channels 3320 and corresponding embedded wickless capillary driven heat pipes 3322 can be varied, depending on the thermal characteristics of the devices installed on the display device layer 3310 or the adjacent display device layers. In some cases, it can be beneficial to orient the in-built channels 3320 and corresponding embedded wickless capillary driven heat pipes 3322 orthogonally to draw heat from the center or other evaporator regions of the display device layer 3310 to the edges, a top side, or other condenser regions. In other cases, it can be beneficial to orient the in-built channels 3320 and corresponding embedded wickless capillary driven heat pipes 3322 radially to draw heat from the center or other evaporator regions of the display device layer 3310 to the edges, a top side, or other condenser regions. In other cases, it can be beneficial to orient the in-built channels 3320 and corresponding embedded wickless capillary driven heat pipes 3322 in a serpentine pattern or other pattern to draw heat from the center or other evaporator regions of the display device layer 3310 to the edges, a top side, other condenser regions, or to areas of the display device layer 3310 configured to dissipate heat more efficiently. As such, the number of channels 3320 and embedded wickless capillary driven heat pipes 3322, the routing of the channels, and geometries of the embedded wickless capillary driven heat pipes can be configured for a particular application and/or a particular display device layer 3310. As such, the example embodiments can provide channels to remove the excess heat from an LED backlight source, for example, to the edges, a top side, or other condenser region. In an example embodiment, the cooler portion of the display layer acts as a condenser region. The channels 3320 and the embedded wickless capillary driven heat pipes 3322 therein can be built in one or more of the display device layers.

The example embodiment shown in FIG. 24 can provide several benefits, including cooler and more efficient display devices, less power consumption, less temperature gradient, and better cooling at the source. The cross patterns of the in-built channels 3320 and the corresponding embedded wickless capillary driven heat pipes 3322 can also help with changes to the orientation of the display device layer 3310 or the display device. The embodiment shown in FIG. 24 can also provide several advantages over the existing technologies including improved manufacturability over the current methods, better performance for a given form factor, smaller fan sizes, lighter weight, fewer complications, higher effective thermal conductivities, and the advantage of being integrated within display device versus attached on the back of the display device.

FIG. 25 illustrates an example embodiment 3400 of a display device with embedded capillary based wickless heat pipe micro-channels 3420 in the back plate layer 3410 of the display device. As well-known to those of ordinary skill in the art, conventional display devices are often manufactured in a modular fashion with a plurality of stacked layers that, in combination, present a visual image to a viewer when in operation. As shown in FIG. 25, these display device layers can include a cover glass layer, a polarizer, another glass layer, a color filter, a liquid crystal layer, a thin-film-transistor layer (TFT), another glass layer, another polarizer, a diffuser, a display light guide plate layer, a reflector, and a back support plate layer 3410, among other layers. As described in detail above, one or more of the layers of the display device can be modified to include capillary based wickless heat pipes integrated or embedded into the layer of a display device for better thermal management. For example, the embodiment shown in FIG. 25 provides in-built channels 3420 in the display device layer 3410, created in the display device layer fabrication process, to remove the excess heat from portions of the display device layer 3410 where high levels of excess heat are present, and to transfer the heat to the sides of the display device layer 3410 by operation of wickless capillary driven heat pipes inserted, integrated, or otherwise embedded into the in-built channels 3420. The structure, fabrication, and operation of the embedded wickless capillary driven heat pipes is described in detail above. For example, FIGS. 9 through 12 described above detail various processes for the fabrication of embedded wickless capillary driven heat pipes in a substrate, such as a display device layer, display device light guide, display device back plate, or the like. In an example embodiment, the wickless capillary driven heat pipes can be embedded into a separate layer of the substrate. For example, a top or plan view of the display device layer 3410 shown in FIG. 25 illustrates the fabrication of the in-built channels 3420 and the wickless capillary driven heat pipes embedded therein. Because the wickless capillary driven heat pipes are embedded into the substrate of the display device layer 3410, the wickless capillary driven heat pipes can draw heat from the surrounding substrate and transfer the heat to other portions of the display device layer 3410 by operation of the fluid and air bubble within each wickless capillary driven heat pipe as described above. As shown in FIG. 25, the size and orientation of the in-built channels 3420 and the corresponding embedded wickless capillary driven heat pipes can be varied, depending on the thermal characteristics of the devices installed on the display device layer 3410 or the adjacent display device layers.

Referring now to FIG. 26, a processing flow diagram illustrates an example embodiment of a method 1100 as described herein. The method 1100 of an example embodiment includes: fabricating a display device layer from a substrate (processing block 1110); integrating a plurality of in-built channels into the display device layer (processing block 1120); and embedding a plurality of wickless capillary driven constrained vapor bubble heat pipes into the plurality of in-built channels, each wickless capillary driven constrained vapor bubble heat pipe including a body having a capillary therein with generally square corners and a high energy interior surface, and a highly wettable liquid partially filling the capillary to dissipate heat between an evaporator region and a condenser region (processing block 1130).

Embodiments described herein are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size can be manufactured. In addition, well-known power/ground connections to integrated circuit (IC) chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the system platform within which the embodiment is to be implemented, i.e., such specifics should be well within purview of one of ordinary skill in the art. Where specific details (e.g., circuits) are set forth in order to describe example embodiments, it should be apparent to one of ordinary skill in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Included herein is a set of process or logic flows representative of example methodologies for performing novel aspects of the disclosed architecture. While, for purposes of simplicity of explanation, the one or more methodologies shown herein are shown and described as a series of acts, those of ordinary skill in the art will understand and appreciate that the methodologies are not limited by the order of acts. Some acts may, in accordance therewith, occur in a different order and/or concurrently with other acts from those shown and described herein. For example, those of ordinary skill in the art will understand and appreciate that a methodology can alternatively be represented as a series of interrelated states or events, such as in a state diagram. Moreover, not all acts illustrated in a methodology may be required for a novel implementation. A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The example embodiments disclosed herein are not limited in this respect.

The various elements of the example embodiments as previously described with reference to the figures may include or be used with various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The example embodiments described herein provide a technical solution to a technical problem. The various embodiments improve the functioning of the electronic device and a related system by enabling the fabrication and use of systems and methods for providing and using a wickless capillary driven constrained vapor bubble heat pipe to dissipate heat. The various embodiments also serve to transform the state of various system components based on better thermal dissipation characteristics of the electronic devices and systems. Additionally, the various embodiments effect an improvement in a variety of technical fields including the fields of thermal management, electronic systems and device fabrication and use, circuit board fabrication, semiconductor device fabrication and use, computing and networking devices, and mobile communication devices.

Figure 27:
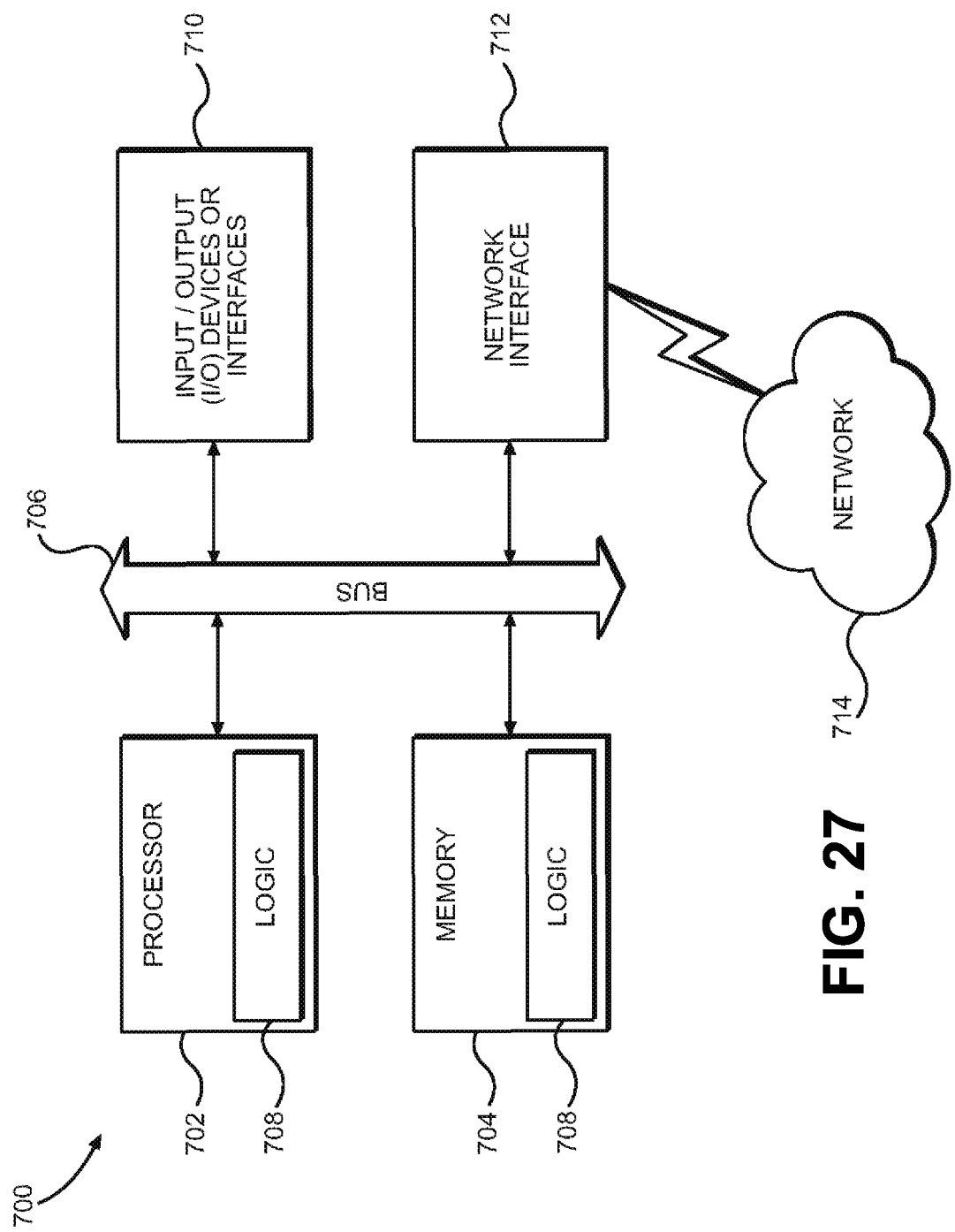
FIG. 27 shows a diagrammatic representation of a machine in the example form of a mobile computing and/or communication system within which a set of instructions when executed and/or processing logic when activated may cause the machine to perform any one or more of the methodologies described and/or claimed herein.

FIG. 27 illustrates a diagrammatic representation of a machine in the example form of an electronic device, such as a mobile computing and/or communication system 700 within which a set of instructions when executed and/or processing logic when activated may cause the machine to perform any one or more of the methodologies described and/or claimed herein. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a laptop computer, a tablet computing system, a Personal Digital Assistant (PDA), a cellular telephone, a smartphone, a web appliance, a set-top box (STB), a network router, switch or bridge, or any machine capable of executing a set of instructions (sequential or otherwise) or activating processing logic that specify actions to be taken by that machine. Further, while only a single machine is illustrated, the term "machine" can also be taken to include any collection of machines that individually or jointly execute a set (or multiple sets) of instructions or processing logic to perform any one or more of the methodologies described and/or claimed herein.

The example mobile computing and/or communication system 700 includes a data processor 702 (e.g., a System-on-a-Chip [SoC], general processing core, graphics core, and optionally other processing logic) and a memory 704, which can communicate with each other via a bus or other data transfer system 706. The mobile computing and/or communication system 700 may further include various input/output (I/O) devices and/or interfaces 710, such as a touchscreen display and optionally a network interface 712. In an example embodiment, the network interface 712 can include one or more radio transceivers configured for compatibility with any one or more standard wireless and/or cellular protocols or access technologies (e.g., 2nd (2G), 2.5, 3rd (3G), 4th (4G) generation, and future generation radio access for cellular systems, Global System for Mobile communication (GSM), General Packet Radio Services (GPRS), Enhanced Data GSM Environment (EDGE), Wideband Code Division Multiple Access (WCDMA), LTE, CDMA2000, WLAN, Wireless Router (WR) mesh, and the like). Network interface 712 may also be configured for use with various other wired and/or wireless communication protocols, including TCP/IP, UDP, SIP, SMS, RTP, WAP, CDMA, TDMA, UMTS, UWB, WiFi, WiMax, Bluetooth™, IEEE 802.11x, and the like. In essence, network interface 712 may include or support virtually any wired and/or wireless communication mechanisms by which information may travel between the mobile computing and/or communication system 700 and another computing or communication system via network 714.

The memory 704 can represent a machine-readable medium on which is stored one or more sets of instructions, software, firmware, or other processing logic (e.g., logic 708) embodying any one or more of the methodologies or functions described and/or claimed herein. The logic 708, or a portion thereof, may also reside, completely or at least partially within the processor 702 during execution thereof by the mobile computing and/or communication system 700. As such, the memory 704 and the processor 702 may also constitute machine-readable media. The logic 708, or a portion thereof, may also be configured as processing logic or logic, at least a portion of which is partially implemented in hardware. The logic 708, or a portion thereof, may further be transmitted or received over a network 714 via the network interface 712. While the machine-readable medium of an example embodiment can be a single medium, the term "machine-readable medium" should be taken to include a single non-transitory medium or multiple non-transitory media (e.g., a centralized or distributed database, and/or associated caches and computing systems) that store the one or more sets of instructions. The term "machine-readable medium" can also be taken to include any non-transitory medium that is capable of storing, encoding or carrying a set of instructions for execution by the machine and that cause the machine to perform any one or more of the methodologies of the various embodiments, or that is capable of storing, encoding or carrying data structures utilized by or associated with such a set of instructions. The term "machine-readable medium" can accordingly be taken to include, but not be limited to, solid-state memories, optical media, and magnetic media.

With general reference to notations and nomenclature used herein, the description presented herein may be disclosed in terms of program procedures executed on a computer or a network of computers. These procedural descriptions and representations may be used by those of ordinary skill in the art to convey their work to others of ordinary skill in the art.

A procedure is generally conceived to be a self-consistent sequence of operations performed on electrical, magnetic, or optical signals capable of being stored, transferred, combined, compared, and otherwise manipulated. These signals may be referred to as bits, values, elements, symbols, characters, terms, numbers, or the like. It should be noted, however, that all of these and similar terms are to be associated with the appropriate physical quantities and are merely convenient labels applied to those quantities. Further, the manipulations performed are often referred to in terms such as adding or comparing, which operations may be executed by one or more machines. Useful machines for performing operations of various embodiments may include general-purpose digital computers or similar devices. Various embodiments also relate to apparatus or systems for performing these operations. This apparatus may be specially constructed for a purpose, or it may include a general-purpose computer as selectively activated or reconfigured by a computer program stored in the computer. The procedures presented herein are not inherently related to a particular computer or other apparatus. Various general-purpose machines may be used with programs written in accordance with teachings herein, or it may prove convenient to construct more specialized apparatus to perform methods described herein.

Various example embodiments using these new techniques are described in more detail herein. In various embodiments as described herein, example embodiments include at least the following examples.

An apparatus comprising: a display device layer fabricated from a substrate, the display device layer including a plurality of in-built channels integrated therein; and a plurality of wickless capillary driven constrained vapor bubble heat pipes being embedded into the plurality of in-built channels, each wickless capillary driven constrained vapor bubble heat pipe including a body having a capillary therein with generally square corners and a high energy interior surface, and a highly wettable liquid partially filling the capillary to dissipate heat between an evaporator region and a condenser region.

The apparatus as described above wherein the display device layer is of a type from the group consisting of: a display device light guide, and a display device back plate.

The apparatus as described above wherein the display device layer is configured for installation in a display device of a type from the group consisting of: a computing device monitor, a television monitor, and a lighted display panel.

The apparatus as described above wherein the display device layer is installed in a display device adjacent to at least one other display device layer of the display device.

The apparatus as described above wherein the plurality of in-built channels and the plurality of wickless capillary driven constrained vapor bubble heat pipes embedded therein are configured in a generally orthogonal orientation.

The apparatus as described above wherein the plurality of in-built channels and the plurality of wickless capillary driven constrained vapor bubble heat pipes embedded therein are configured in a generally radial orientation.

The apparatus as described above wherein the plurality of in-built channels and the plurality of wickless capillary driven constrained vapor bubble heat pipes embedded therein are configured in a generally cross-pattern orientation.

A display system comprising: a plurality of display device layers configured to operate in combination to produce an image for a viewer; at least one of the plurality of display device layers including a plurality of in-built channels integrated therein; and a plurality of wickless capillary driven constrained vapor bubble heat pipes being embedded into the plurality of in-built channels of the at least one of the plurality of display device layers, each wickless capillary driven constrained vapor bubble heat pipe including a body having a capillary therein with generally square corners and a high energy interior surface, and a highly wettable liquid partially filling the capillary to dissipate heat between an evaporator region and a condenser region.

The display system as described above wherein the at least one of the plurality of display device layers is of a type from the group consisting of: a display device light guide, and a display device back plate.

The display system as described above wherein the display device of a type from the group consisting of: a computing device monitor, a television monitor, and a lighted display panel.

The display system as described above wherein the at least one of the plurality of display device layers is installed in the display device adjacent to at least one other display device layer of the display device.

The display system as described above wherein the plurality of in-built channels and the plurality of wickless capillary driven constrained vapor bubble heat pipes embedded therein are configured in a generally orthogonal orientation.

The display system as described above wherein the plurality of in-built channels and the plurality of wickless capillary driven constrained vapor bubble heat pipes embedded therein are configured in a generally radial orientation.

The display system as described above wherein the plurality of in-built channels and the plurality of wickless capillary driven constrained vapor bubble heat pipes embedded therein are configured in a generally cross-pattern orientation.

A method comprising: fabricating a display device layer from a substrate; integrating a plurality of in-built channels into the display device layer; and embedding a plurality of wickless capillary driven constrained vapor bubble heat pipes into the plurality of in-built channels, each wickless capillary driven constrained vapor bubble heat pipe including a body having a capillary therein with generally square corners and a high energy interior surface, and a highly wettable liquid partially filling the capillary to dissipate heat between an evaporator region and a condenser region.

The method as described above wherein the display device layer is of a type from the group consisting of: a display device light guide, and a display device back plate.

The method as described above including configuring the display device layer for installation in a display device of a type from the group consisting of: a computing device monitor, a television monitor, and a lighted display panel.

The method as described above including installing the display device layer in a display device adjacent to at least one other display device layer of the display device.

The method as described above wherein the plurality of in-built channels and the plurality of wickless capillary driven constrained vapor bubble heat pipes embedded therein are configured in a generally orthogonal orientation.

The method as described above wherein the plurality of in-built channels and the plurality of wickless capillary driven constrained vapor bubble heat pipes embedded therein are configured in a generally radial orientation.

The method as described above wherein the plurality of in-built channels and the plurality of wickless capillary driven constrained vapor bubble heat pipes embedded therein are configured in a generally cross-pattern orientation.

An apparatus comprising: a display device layer fabricated from a substrate, the display device layer including a plurality of in-built channels integrated therein; and a plurality of wickless heat dissipation means being embedded into the plurality of in-built channels, each wickless heat dissipation means including a body having a capillary therein with generally square corners and a high energy interior surface, and a highly wettable liquid partially filling the capillary to dissipate heat between an evaporator region and a condenser region.

The apparatus as described above wherein the display device layer is of a type from the group consisting of: a display device light guide, and a display device back plate.

The apparatus as described above wherein the display device layer is configured for installation in a display device of a type from the group consisting of: a computing device monitor, a television monitor, and a lighted display panel.

The apparatus as described above wherein the display device layer is installed in a display device adjacent to at least one other display device layer of the display device.

The apparatus as described above wherein the plurality of in-built channels and the plurality of wickless heat dissipation means embedded therein are configured in a generally orthogonal orientation.

The apparatus as described above wherein the plurality of in-built channels and the plurality of wickless heat dissipation means embedded therein are configured in a generally radial orientation.

The apparatus as described above wherein the plurality of in-built channels and the plurality of wickless heat dissipation means embedded therein are configured in a generally cross-pattern orientation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
   a display device layer fabricated from a substrate, the display device layer including a plurality of in-built channels integrated therein; and
   a plurality of wickless capillary driven constrained vapor bubble heat pipes embedded into the plurality of in-built channels, the plurality of wickless capillary driven constrained vapor bubble heat pipes including a body having a capillary therein with corners, wherein the capillary is to be partially filled with a liquid to dissipate heat between an evaporator region and a condenser region.

2. The apparatus of claim 1, wherein the display device layer includes at least one of a display device light guide or a display device back plate.

3. The apparatus of claim 1, wherein the display device layer is configured for installation in at least one of a computing device monitor, a television monitor, or a lighted display panel.

4. The apparatus of claim 1, wherein the display device layer is installed in a display device adjacent to at least one other display device layer of the display device.

5. The apparatus of claim 1, wherein the plurality of in-built channels and the plurality of wickless capillary driven constrained vapor bubble heat pipes embedded therein are configured in a generally orthogonal orientation.

6. The apparatus of claim 1, wherein the plurality of in-built channels and the plurality of wickless capillary driven constrained vapor bubble heat pipes embedded therein are configured in a generally radial orientation.

7. The apparatus of claim 1, wherein the plurality of in-built channels and the plurality of wickless capillary driven constrained vapor bubble heat pipes embedded therein are configured in a generally cross-pattern orientation.

8. A display system comprising:
   a plurality of display device layers to operate in combination to produce an image for a viewer;
   at least one of the plurality of display device layers including a plurality of in-built channels integrated therein; and
   a plurality of wickless capillary driven constrained vapor bubble heat pipes being embedded into the plurality of in-built channels of the at least one of the plurality of display device layers, the plurality of wickless capillary driven constrained vapor bubble heat pipes including a body having a capillary therein with generally square corners and a liquid partially filling the capillary to dissipate heat between an evaporator region and a condenser region.

9. The display system of claim 8, wherein the at least one of the plurality of display device layers includes at least one of a display device light guide or a display device back plate.

10. The display system of claim 8, wherein the display device includes at least one of a computing device monitor, a television monitor, or a lighted display panel.

11. The display system of claim 8, wherein the at least one of the plurality of display device layers is installed in the display device adjacent to at least one other display device layer of the display device.

12. The display system of claim 8, wherein the plurality of in-built channels and the plurality of wickless capillary driven constrained vapor bubble heat pipes embedded therein are configured in a generally orthogonal orientation.

13. A method comprising:
    fabricating a display device layer from a substrate;
    integrating a plurality of in-built channels into the display device layer; and
    embedding a plurality of wickless capillary driven constrained vapor bubble heat pipes into the plurality of in-built channels, the plurality of wickless capillary driven constrained vapor bubble heat pipes including a body having a capillary therein with generally square corners, wherein the capillary is to be partially filled with a liquid to dissipate heat between an evaporator region and a condenser region.

14. The method of claim 13, wherein the display device layer includes at least one of a display device light guide or a display device back plate.

15. The method of claim 13, further including configuring the display device layer for installation in a display device including at least one of a computing device monitor, a television monitor, or a lighted display panel.

16. The method of claim 13, wherein the plurality of in-built channels and the plurality of wickless capillary driven constrained vapor bubble heat pipes embedded therein are configured in a generally orthogonal orientation.

17. The method of claim 13, wherein the plurality of in-built channels and the plurality of wickless capillary driven constrained vapor bubble heat pipes embedded therein are configured in a generally radial orientation.

18. An apparatus comprising:
    a display device layer fabricated from a substrate, the display device layer including a plurality of in-built channels integrated therein; and
    a plurality of wickless heat dissipation means being embedded into the plurality of in-built channels, the plurality of wickless heat dissipation means including a body having a capillary therein with generally square corners and a liquid partially filling the capillary to dissipate heat between an evaporator region and a condenser region.

19. The apparatus of claim 18, wherein the display device layer includes at least one of a display device light guide or a display device back plate.

20. The apparatus of claim 18, wherein the display device layer is configured for installation in a display device including at least one of a computing device monitor, a television monitor, or a lighted display panel.

21. The apparatus of claim 1, wherein the body includes at least two corners and a curved wall coupled between the two corners.

22. The apparatus of claim 1, wherein at least one of the corners is square.

23. The apparatus of claim 1, wherein at least one of the corners is formed by a first straight edge coupled to a second straight edge at an acute angle.

24. The apparatus of claim 23, wherein the body further includes:
    a first base edge coupled to the first straight edge;

a first curved wall coupled to the first base edge opposite the first straight edge;
a second base edge coupled to the second straight edge; and
a second curved wall coupled to the second base edge opposite the second straight edge.

* * * * *